(12) United States Patent
Zheng et al.

(10) Patent No.: US 11,688,343 B2
(45) Date of Patent: Jun. 27, 2023

(54) PIXEL DRIVING CIRCUIT AND METHOD OF DRIVING THE SAME, DISPLAY SUBSTRATE AND DISPLAY DEVICE

(71) Applicant: BOE Technology Group Co., Ltd., Beijing (CN)

(72) Inventors: Can Zheng, Beijing (CN); Jianchao Zhu, Beijing (CN); Lujiang Huangfu, Beijing (CN); Libin Liu, Beijing (CN); Shiming Shi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 17 days.

(21) Appl. No.: 17/626,474

(22) PCT Filed: Jan. 27, 2021

(86) PCT No.: PCT/CN2021/073957
§ 371 (c)(1),
(2) Date: Jan. 11, 2022

(87) PCT Pub. No.: WO2022/160125
PCT Pub. Date: Aug. 4, 2022

(65) Prior Publication Data
US 2023/0154402 A1    May 18, 2023

(51) Int. Cl.
*G09G 3/3233* (2016.01)
(52) U.S. Cl.
CPC ..... *G09G 3/3233* (2013.01); *G09G 2300/043* (2013.01); *G09G 2300/0426* (2013.01);
(Continued)

(58) Field of Classification Search
None
See application file for complete search history.

(56) References Cited

U.S. PATENT DOCUMENTS

2009/0009441 A1    1/2009   Yamamoto et al.
2009/0225013 A1*   9/2009   Lee ..................... G09G 3/3233
                                                           345/80
(Continued)

FOREIGN PATENT DOCUMENTS

CN          1700289 A     11/2005
CN        103413812 A     11/2013
(Continued)

*Primary Examiner* — Dorothy Harris
(74) *Attorney, Agent, or Firm* — IPro, PLLC

(57) ABSTRACT

In a pixel driving circuit, a compensation sub-circuit is respectively coupled to a first control terminal, a control terminal and a second terminal of the driving sub-circuit; a first terminal of the first coupling sub-circuit is coupled to the control terminal of the driving sub-circuit; a first terminal of the second coupling sub-circuit is coupled to a second terminal of the first coupling sub-circuit; a first reset sub-circuit is respectively coupled to a second control terminal, the control terminal of the driving sub-circuit and an initialization signal output terminal; a second reset sub-circuit is respectively coupled to a third control terminal, a second terminal of the first coupling sub-circuit and the first level signal output terminal; a first light emitting control sub-circuit is respectively coupled to a light emitting control terminal, a second terminal of the second coupling sub-circuit and a reference signal output terminal.

20 Claims, 14 Drawing Sheets

(52) U.S. Cl.
CPC ............... *G09G 2300/0819* (2013.01); *G09G 2300/0852* (2013.01); *G09G 2300/0861* (2013.01); *G09G 2310/0297* (2013.01); *G09G 2310/08* (2013.01); *G09G 2320/0242* (2013.01); *G09G 2320/0257* (2013.01); *G09G 2320/045* (2013.01); *G09G 2330/021* (2013.01)

(56) References Cited

U.S. PATENT DOCUMENTS

| | | | |
|---|---|---|---|
| 2010/0220038 A1* | 9/2010 | Chung | G09G 3/3233 345/76 |
| 2012/0026143 A1* | 2/2012 | Jang | G09G 5/00 345/76 |
| 2013/0057532 A1 | 3/2013 | Lee et al. | |
| 2014/0118229 A1 | 5/2014 | Han | |
| 2014/0333686 A1* | 11/2014 | Kim | G09G 3/3233 345/82 |
| 2015/0279859 A1 | 10/2015 | Chen et al. | |
| 2015/0348464 A1* | 12/2015 | In | G09G 3/2022 345/82 |
| 2016/0035760 A1 | 2/2016 | Ning et al. | |
| 2016/0117983 A1 | 4/2016 | Li et al. | |
| 2016/0233247 A1 | 8/2016 | Bai et al. | |
| 2016/0247821 A1 | 8/2016 | Li et al. | |
| 2017/0047002 A1 | 2/2017 | Xuan et al. | |
| 2017/0249898 A1 | 8/2017 | Ma | |
| 2017/0270860 A1 | 9/2017 | Wang et al. | |
| 2019/0251904 A1 | 8/2019 | Kim et al. | |
| 2019/0259785 A1 | 8/2019 | Lee et al. | |
| 2019/0295470 A1 | 9/2019 | Kim et al. | |
| 2020/0027402 A1 | 1/2020 | Xiao et al. | |
| 2020/0105793 A1 | 4/2020 | Ding et al. | |
| 2020/0105801 A1 | 4/2020 | Zhou et al. | |
| 2020/0161402 A1 | 5/2020 | Wang et al. | |
| 2020/0193903 A1 | 6/2020 | Park et al. | |
| 2020/0234648 A1 | 7/2020 | Zhu et al. | |
| 2020/0381524 A1 | 12/2020 | Xu et al. | |
| 2021/0126072 A1 | 4/2021 | Cho et al. | |
| 2021/0134917 A1* | 5/2021 | Li | G09G 3/3266 |
| 2021/0167155 A1 | 6/2021 | Xu et al. | |
| 2022/0004304 A1 | 1/2022 | Yang et al. | |
| 2022/0068212 A1 | 3/2022 | Yao et al. | |
| 2022/0157249 A1 | 5/2022 | Park et al. | |
| 2022/0181454 A1 | 6/2022 | Xu et al. | |

FOREIGN PATENT DOCUMENTS

| | | |
|---|---|---|
| CN | 103489826 A | 1/2014 |
| CN | 103928472 A | 7/2014 |
| CN | 103971640 A | 8/2014 |
| CN | 104464616 A | 3/2015 |
| CN | 104576659 A | 4/2015 |
| CN | 105185305 A | 12/2015 |
| CN | 105185306 A | 12/2015 |
| CN | 205920745 U | 2/2017 |
| CN | 107316613 A | 11/2017 |
| CN | 108550553 A | 9/2018 |
| CN | 108665852 A | 10/2018 |
| CN | 108695394 A | 10/2018 |
| CN | 108767016 A | 11/2018 |
| CN | 108806587 A | 11/2018 |
| CN | 109064972 A | 12/2018 |
| CN | 109192143 A | 1/2019 |
| CN | 109300995 A | 2/2019 |
| CN | 109360828 A | 2/2019 |
| CN | 110491881 A | 11/2019 |
| CN | 110520832 A | 11/2019 |
| CN | 110729324 A | 1/2020 |
| CN | 110767539 A | 2/2020 |
| CN | 111613177 A | 9/2020 |
| CN | 111627387 A | 9/2020 |
| CN | 111739908 A | 10/2020 |
| CN | 111816691 A | 10/2020 |
| KR | 20200073419 A | 6/2020 |

* cited by examiner

US 11,688,343 B2

PIXEL DRIVING CIRCUIT AND METHOD OF DRIVING THE SAME, DISPLAY SUBSTRATE AND DISPLAY DEVICE

CROSS-REFERENCE TO RELATED APPLICATION

The present application is the U.S. national phase of PCT Application No. PCT/CN2021/073957 filed on Jan. 27, 2021, which is incorporated herein by reference in its entirety.

TECHNICAL FIELD

The present disclosure relates to the field of display technology, and more particularly to a pixel driving circuit and a method of driving the same, a display substrate and a display device.

BACKGROUND

Organic Light emitting Diode (OLED) display devices are widely used in various fields for their advantages of high brightness, low power consumption, fast response, high definition, good flexibility, and high light emitting efficiency. OLED display devices require different driving frequencies in different application scenarios, and commonly used driving modes include low-frequency driving and high-frequency driving.

SUMMARY

The objective of the disclosed solution is to provide a pixel driving circuit, a method of driving the same, a display substrate and a display device.

In order to solved the above technical problem, a pixel driving circuit for driving a light emitting element, the pixel driving circuit includes: a driving sub-circuit, a first terminal of the driving sub-circuit being coupled to a first level signal output terminal, a second terminal of the driving sub-circuit being coupled to the light emitting element; the driving sub-circuit including a third active pattern; a compensation sub-circuit, respectively coupled to a first control terminal, a control terminal of the driving sub-circuit and the second terminal of the driving sub-circuit; the compensation sub-circuit including a second active pattern; a first coupling sub-circuit, a first terminal of the first coupling sub-circuit being coupled to the control terminal of the driving sub-circuit; a second coupling sub-circuit, a first terminal of the second coupling sub-circuit being coupled to a second terminal of the first coupling sub-circuit; a first reset sub-circuit, respectively coupled to a second control terminal, the control terminal of the driving sub-circuit and an initialization signal output terminal; the first reset sub-circuit including a fourth active pattern; a second reset sub-circuit, respectively coupled to a third control terminal, a second terminal of the first coupling sub-circuit and the first level signal output terminal; the second reset sub-circuit including a fifth active pattern; a first light emitting control sub-circuit, respectively coupled to a light emitting control terminal, a second terminal of the second coupling sub-circuit and a reference signal output terminal; a data writing-in sub-circuit, respectively coupled to a writing-in control terminal, the second terminal of the second coupling sub-circuit and a data signal input terminal; wherein the second active pattern, the fourth active pattern, and the fifth active pattern are all arranged at different layers from the third active pattern.

Optionally, the pixel driving circuit further includes: a second light emitting control sub-circuit, respectively coupled to the light emitting control terminal, the second terminal of the driving sub-circuit and the light emitting element; configured to control to electrically connect or disconnect the second terminal of the driving sub-circuit and the light emitting element under the control of the light emitting control terminal; a third reset sub-circuit, respectively coupled to the first control terminal, the light emitting element and the initialization signal output terminal; configured to control to electrically connect or disconnect the light emitting element and the initialization signal output terminal under the control of the first control terminal.

Optionally, the pixel driving circuit further includes: a second light emitting control sub-circuit, the second terminal of the driving sub-circuit being coupled to the light emitting element through the second light emitting control sub-circuit; the second light emitting control sub-circuit being respectively coupled to the light emitting control terminal, the second terminal of the driving sub-circuit and the light emitting element; configured to control to electrically connect or disconnect the second terminal of the driving sub-circuit and the light emitting element under the control of the light emitting control terminal; a fourth reset sub-circuit, respectively coupled to the writing-in control terminal, the light emitting element and the initialization signal output terminal; configured to control to electrically connect or disconnect the light emitting element and the initialization signal output terminal under the control of the writing-in control terminal.

Optionally, the data writing-in sub-circuit includes a first transistor, the compensation sub-circuit includes a second transistor, and the driving sub-circuit includes a third transistor, the first reset sub-circuit includes a fourth transistor, the second reset sub-circuit includes a fifth transistor, the first light emitting control sub-circuit includes a sixth transistor, and the first coupling sub-circuit includes a first capacitor, the second coupling sub-circuit includes a second capacitor; a gate electrode of the first transistor is coupled to the writing-in control terminal, a first electrode of the first transistor is coupled to the data signal input terminal, and a second electrode of the first transistor is coupled to a second terminal of the second capacitor; a gate electrode of the second transistor is coupled to the first control terminal, a first electrode of the second transistor is coupled to a second electrode of the third transistor, and a second electrode of the second transistor is coupled to a gate electrode of the third transistor; a first electrode of the third transistor is coupled to the first level signal output terminal; a gate electrode of the fourth transistor is coupled to the second control terminal, a first electrode of the fourth transistor is coupled to the initialization signal output terminal, and a second electrode of the fourth transistor is coupled to the gate electrode of the third transistor; a gate electrode of the fifth transistor is coupled to the third control terminal, a first electrode of the fifth transistor is coupled to the first level signal output terminal, and a second electrode of the fifth transistor is coupled to a second terminal of the first capacitor; a gate electrode of the sixth transistor is coupled to the light emitting control terminal, a first electrode of the sixth transistor is coupled to the reference signal output terminal, and a second electrode of the sixth transistor is coupled to the second terminal of the second capacitor; a first terminal of the first capacitor is coupled to the gate electrode of the third transistor; a first terminal of the second capacitor is coupled to the second terminal of the first capacitor.

Optionally, the first transistor, the third transistor, and the sixth transistor all include P-type low-temperature polysilicon transistors, and the second transistor, the fourth transistor and the fifth transistor all include N-type oxide transistors.

Optionally, the second light emitting control sub-circuit includes a seventh transistor, and a gate electrode of the seventh transistor is coupled to the light emitting control terminal, a first electrode of the seventh transistor is coupled to the second terminal of the driving sub-circuit, and a second electrode of the seventh transistor is coupled to the light emitting element; the third reset sub-circuit includes an eighth transistor, a gate electrode of the eighth transistor is coupled to the first control terminal, and a first electrode of the eighth transistor is coupled to the initialization signal output terminal, and a second electrode of the eighth transistor is coupled to the light emitting element.

Optionally, the second light emitting control sub-circuit includes a seventh transistor, and a gate electrode of the seventh transistor is coupled to the light emitting control terminal, a first electrode of the seventh transistor is coupled to the second terminal of the driving sub-circuit, and a second electrode of the seventh transistor is coupled to the light emitting element; the fourth reset sub-circuit includes a ninth transistor, a gate electrode of the ninth transistor is coupled to the writing-in control terminal, and a first electrode of the ninth transistor is coupled to the initialization signal output terminal, and the second electrode of the ninth transistor is coupled to the light emitting element.

Based on the technical solution of the pixel driving circuit, a second aspect of the disclosure provides a method of driving the pixel driving circuit, wherein the method includes: within each display period, in a reset phase, under the control of the second control terminal, the first reset sub-circuit controlling to electrically connect the control terminal of the driving sub-circuit and the initialization signal output terminal; under the control of the third control terminal, the second reset sub-circuit controlling to electrically connect the second terminal of the first coupling sub-circuit and the first level signal output terminal; under the control of the writing-in control terminal, the data writing-in sub-circuit controlling to electrically connect the second terminal of the second coupling sub-circuit and the data signal input terminal; in a compensation phase, under the control of the second control terminal, the first reset sub-circuit controlling to disconnect the electric connection between the control terminal of the driving sub-circuit and the initialization signal output terminal; under the control of the third control terminal, the second reset sub-circuit continuing to control to electrically connect the second terminal of the first coupling sub-circuit and the first level signal output terminal; under the control of the writing-in control terminal, the data writing-in sub-circuit controlling to disconnect the electric connection between the second terminal of the second coupling sub-circuit and the data signal input terminal; under the control of the first control terminal, the compensation sub-circuit controlling to electrically connect the control terminal of the driving sub-circuit and the second terminal of the driving sub-circuit; the driving sub-circuit controlling to electrically connect the first level signal output terminal and the compensation sub-circuit until a threshold voltage of the driving sub-circuit is written into the control terminal of the driving sub-circuit; in a light emitting phase, under the control of the second control terminal, the first reset sub-circuit controlling to disconnect the electric connection between the control terminal of the driving sub-circuit and the initialization signal output terminal; under the control of the third control terminal, the second reset sub-circuit controlling to disconnect the electric connection between the second terminal of the first coupling sub-circuit and the first level signal output terminal; under the control of the writing-in control terminal, the data writing-in sub-circuit controlling to disconnect the electric connection between the second terminal of the second coupling sub-circuit and the data signal input terminal; under the control of the first control terminal, the compensation sub-circuit controlling to disconnect the electric connection between the control terminal of the driving sub-circuit and the second terminal of the driving sub-circuit; under the control of the light emitting control terminal, the first light emitting control sub-circuit controlling to electrically connect the second terminal of the second coupling sub-circuit and the reference signal output terminal; the driving sub-circuit controlling to electrically connect the first level signal output terminal and the light emitting element, and transmit the generated driving signal to the light emitting element.

Optionally, in the case that the pixel driving circuit further includes a second light emitting control sub-circuit and a third reset sub-circuit, the method further includes: in the reset phase, under the control of the light emitting control terminal, the second light emitting control sub-circuit controlling to disconnect the electric connection between the second terminal of the driving sub-circuit and the light emitting element; under the control of the first control terminal, the third reset sub-circuit controlling to disconnect the electric connection between the light emitting element and the initialization signal output terminal; in the compensation phase, under the control of the light emitting control terminal, the second light emitting control sub-circuit controlling to disconnect the electric connection between the second terminal of the driving sub-circuit and the light emitting element; under the control of the first control terminal, the third reset sub-circuit controlling to electrically connect the light emitting element and the initialization signal output terminal; in the light emitting phase, under the control of the light emitting control terminal, the second light emitting control sub-circuit controlling to electrically connect the second terminal of the driving sub-circuit and the light emitting element; under the control of the first control terminal, the third reset sub-circuit controlling to disconnect the electric connection between the light emitting element and the initialization signal output terminal.

Optionally, in the case the pixel driving circuit further includes a second light emitting control sub-circuit and a fourth reset sub-circuit, the method further includes: in the reset phase, under the control of the light emitting control terminal, the second light emitting control sub-circuit controlling to disconnect the electric connection between the second terminal of the driving sub-circuit and the light emitting element; under the control of the writing-in control terminal, the fourth reset sub-circuit controlling to electrically connect the light emitting element and the initialization signal output terminal; in the compensation phase, under the control of the light emitting control terminal, the second light emitting control sub-circuit controlling to disconnect the electric connection between the second terminal of the driving sub-circuit and the light emitting element; under the control of the writing-in control terminal, the fourth reset sub-circuit controlling to disconnect the electric connection between the light emitting element and the initialization signal output terminal; in the light emitting phase, under the control of the light emitting control terminal, the second light emitting control sub-circuit controlling to electrically connect the second terminal of the driving sub-circuit and the light emitting element; under the control of the writing-in control terminal, the fourth reset sub-circuit controlling to disconnect the electric connection between the light emitting element and the initialization signal output terminal.

Based on the technical solution of the pixel driving circuit, a third aspect of the present disclosure provides a display substrate including a substrate and a plurality of sub-pixels arranged in an array on the substrate; wherein the sub-pixel includes the pixel driving circuit, the sub-pixel further includes: a power line pattern, at least part of the power line pattern extending along a first direction, and the power line pattern being multiplexed as the first level signal output terminal; a data line pattern, at least part of the data line pattern extending along the first direction, and the data line pattern being multiplexed as the data signal input terminal; a reference signal line pattern, at least part of the reference signal line pattern extending along the first direction, the reference signal line pattern being multiplexed as the reference signal output terminal; the data line pattern being located between the power line pattern and the reference signal line pattern; a first control signal line pattern, at least part of the first control signal line pattern extending in a second direction, the second direction intersecting the first direction, and the first control signal line pattern being multiplexed as the first control terminal coupled to the compensation sub-circuit in the pixel driving circuit; a second control signal line pattern, at least part of the second control signal line pattern extending along the second direction, and the second control signal line pattern being multiplexed as the second control terminal; a third control signal line pattern, at least part of the third control signal line pattern extending along the second direction, and the third control signal line pattern being multiplexed into the third control terminal; an initialization signal line pattern, at least part of the initialization signal line pattern extending along the second direction, and the initialization signal line pattern being multiplexed as the initialization signal output terminal; a light emitting control signal line pattern, at least part of the light emitting control signal line pattern extending along the second direction, and the light emitting control signal line pattern being multiplexed as the light emitting control terminal; a data writing-in control line pattern, at least part of the data writing-in control line pattern extending along the second direction, and the data writing-in control line pattern being multiplexed as the writing-in control terminal.

Optionally, the data writing-in sub-circuit in the pixel driving circuit includes a first transistor, the compensation sub-circuit includes a second transistor, and the driving sub-circuit includes a third transistor, the first reset sub-circuit includes a fourth transistor, the second reset sub-circuit includes a fifth transistor, the first light emitting control sub-circuit includes a sixth transistor, the first coupling sub-circuit includes a first capacitor, and the second coupling sub-circuit includes a second capacitor; the first capacitor includes a first electrode plate and a second electrode plate disposed oppositely, and the first electrode plate is located between the second electrode plate and the substrate; the second transistor, the fourth transistor, and the fifth transistor all include N-type oxide transistors, the second transistor includes a second active pattern, the fourth transistor includes a fourth active pattern, and the fifth transistor includes a fifth active pattern; the second active pattern, the fourth active pattern, and the fifth active pattern are arranged in the same layer and made of the same material, the fourth active pattern is located between the second control signal line and the substrate, the fourth active pattern is located on a side of the second electrode plate away from the substrate.

Optionally, the second active pattern extends along the second direction, the fourth active pattern extends along the first direction, and the second active pattern and the fourth active pattern are formed into an integrated structure, and an orthographic projection of the second active pattern on the substrate is located between an orthographic projection of the first control signal line pattern on the substrate and an orthographic projection of the second control signal line pattern on the substrate.

Optionally, the fifth active pattern extends along the second direction, and an orthographic projection of the fifth active pattern on the substrate is located between an orthographic projection of the third control signal line pattern ion the substrate and an orthographic projection of the second electrode plate on the substrate.

Optionally, in the case that the pixel driving circuit further includes a second light emitting control sub-circuit and a third reset sub-circuit, the third reset sub-circuit includes an eighth transistor, the eighth transistor includes an eighth active pattern, the eighth active pattern extends along the second direction, and the eighth active pattern and the second active pattern are arranged at a same layer and made of a same material.

Optionally, the third control signal line pattern is multiplexed as the first control terminal coupled to the third reset sub-circuit included in a pixel driving circuit in an adjacent sub-pixel along the first direction, an gate electrode of the eighth transistor is coupled to the third control signal line pattern in the adjacent sub-pixel along the first direction; an orthographic projection of the eighth active pattern on the substrate is located between an orthographic projection of the initialization signal line pattern on the substrate and an orthographic projection of the third control signal line pattern in the adjacent sub-pixel along the first direction on the substrate.

Optionally, in the case that the pixel driving circuit further includes a second light emitting control sub-circuit and a fourth reset sub-circuit, the second light emitting control sub-circuit includes a seventh transistor, the seventh transistor includes a seventh active pattern, the fourth reset sub-circuit includes a ninth transistor, the ninth transistor includes a ninth active pattern, and the seventh active pattern and the ninth active pattern both extend along the first direction, and the seventh active pattern and the ninth active pattern are formed as an integrated structure.

Optionally, an orthographic projection of the ninth active pattern on the substrate is located between the orthographic projection of the light emitting control signal line pattern on the substrate and the orthographic projection of the initialization signal line pattern on the substrate.

Optionally, the plurality of sub-pixels are divided into a plurality of rows of sub-pixels arranged in the first direction, and each row of sub-pixels include a plurality of sub-pixels arranged in the second direction, the display substrate further includes a plurality of first compensation lines, the plurality of first compensation lines correspond to at least part of the plurality of rows of sub-pixels in a one-to-one manner, and the plurality of first compensation lines are respectively coupled to reference signal line patterns included in sub-pixels of the corresponding row of sub-pixels.

Based on the technical solution of the pixel driving circuit, a fourth aspect of the present disclosure provides a display device including the display substrate.

BRIEF DESCRIPTION OF THE DRAWINGS

The drawings described here are used to provide a further understanding of the present disclosure and constitute a part of the present disclosure. The exemplary embodiments and descriptions of the present disclosure are used to explain the present disclosure, and do not constitute an improper limitation of the present disclosure. In the attached drawings.

DETAILED DESCRIPTION

In order to further explain the pixel driving circuit and the driving method thereof, the display substrate, and the display device provided by the embodiments of the present disclosure, a detailed description will be given below in conjunction with the accompanying drawings.

With the gradual increased display demand, the high and low frequency display of the display device has become a hot topic. How the display device is effectively compatible with high-frequency display and low-frequency display to meet people's requirements for high refresh rate and low power consumption functions has become an urgent problem to be solved.

Figure 1:
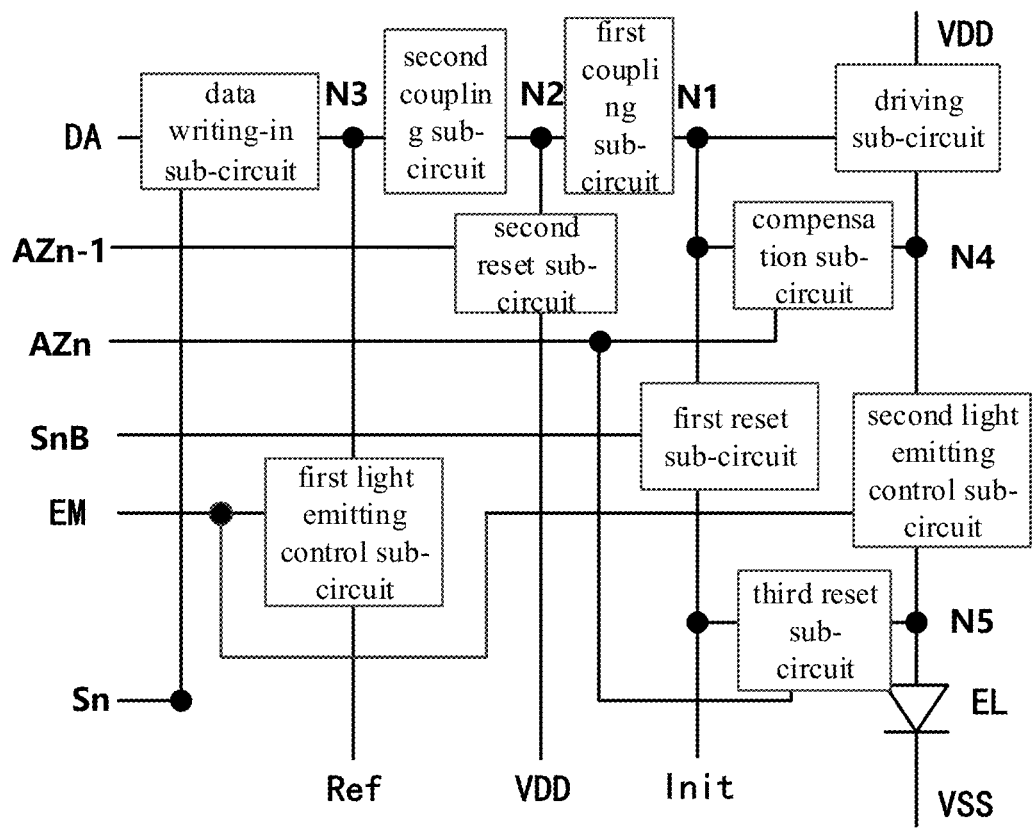
FIG. 1 is a schematic diagram of a first basic structure of a pixel driving circuit according to an embodiment of the disclosure.
Figure 11:
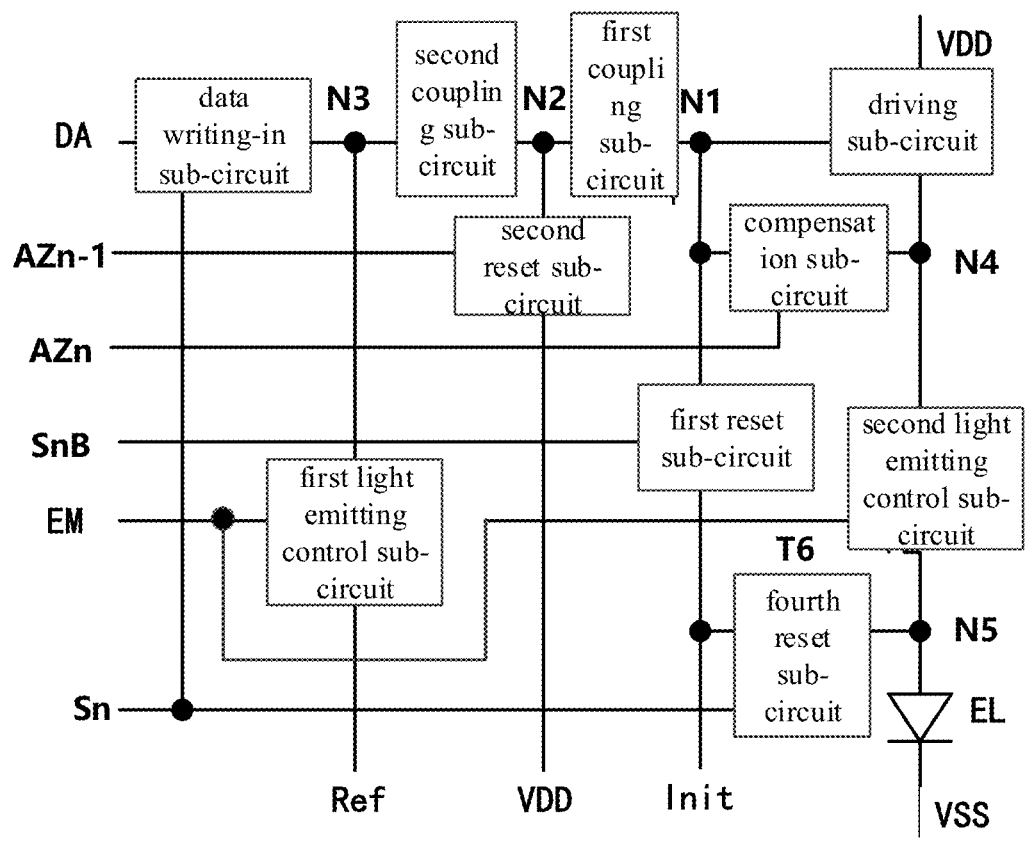
FIG. 11 is a schematic diagram of a second basic structure of a pixel driving circuit according to an embodiment of the disclosure.

Referring to FIG. 1 and FIG. 11, an embodiment of the present disclosure provides a pixel driving circuit for driving a light emitting element EL, and the pixel driving circuit includes:

a driving sub-circuit, a first terminal of the driving sub-circuit is coupled to a first level signal output terminal VDD, a second terminal of the driving sub-circuit is coupled to the light emitting element EL; the driving sub-circuit includes a third active pattern;

a compensation sub-circuit, respectively coupled to a first control terminal AZn, a control terminal of the driving sub-circuit and a second terminal of the driving sub-circuit; the compensation sub-circuit includes a second active pattern;

a first coupling sub-circuit, a first terminal of the first coupling sub-circuit is coupled to the control terminal of the driving sub-circuit;

a second coupling sub-circuit, a first terminal of the second coupling sub-circuit is coupled to a second terminal of the first coupling sub-circuit;

a first reset sub-circuit, respectively coupled to a second control terminal SnB, the control terminal of the driving sub-circuit and an initialization signal output terminal Init; the first reset sub-circuit includes a fourth active pattern;

a second reset sub-circuit, respectively coupled to a third control terminal AZn−1, a second terminal of the first coupling sub-circuit and a first level signal output terminal VDD; configured to: under the control of a third control terminal AZn−1, electrically connect or disconnect a second terminal of the first coupling sub-circuit and the first level signal output terminal VDD; the second reset sub-circuit includes a fifth active pattern;

a first light emitting control sub-circuit, respectively coupled to a light emitting control terminal EM, a second terminal of the second coupling sub-circuit and a reference signal output terminal Ref; and configured to: under the control of the light emitting control terminal EM, electrically connect or disconnect the second terminal of the second coupling sub-circuit and the reference signal output terminal Ref;

a data writing-in sub-circuit, respectively coupled to a writing-in control terminal Sn, the second terminal of the second coupling sub-circuit and a data signal input terminal DA. The second active pattern, the fourth active pattern, and the fifth active pattern are all arranged at different layers from the third active pattern.

Exemplarily, the first level signal outputted by the first level signal output terminal VDD includes a positive power signal.

Exemplarily, an anode of the light emitting element EL is coupled to the second terminal of the driving sub-circuit, a cathode of the light emitting element EL is coupled to the second level signal output terminal VSS, and the second level signal outputted by the second level signal output terminal includes a negative power signal.

Exemplarily, the first terminal of the driving sub-circuit is an input terminal, and the second terminal of the driving sub-circuit is an output terminal. The driving sub-circuit can generate a driving signal and transmit the driving signal to the light emitting element. EL, drive the light emitting element EL to emit light.

Exemplarily, the first control terminal AZn outputs a first control signal, and under the control of the first control signal, the compensation sub-circuit controls to electrically connect or disconnect the control terminal of the driving sub-circuit and the second terminal of the driving sub-circuit.

Exemplarily, the second control terminal SnB outputs a second control signal, and the initialization signal output terminal Init outputs an initialization signal; under the control of the second control signal, the first reset sub-circuit controls to electrically connect or disconnect the control terminal of the driving sub-circuit and the initialization signal output terminal Init, to control whether to transmit the initialization signal to the control terminal of the driving sub-circuit.

Exemplarily, the third control terminal AZn−1 outputs a third control signal, and under the control of the third control signal, the second reset sub-circuit controls to electrically connect or disconnect the second terminal of the first coupling sub-circuit and the first level signal output terminal VDD, to control whether to transmit the first level signal to the second terminal of the first coupling sub-circuit.

Exemplarily, the light emitting control terminal EM outputs a light emitting control signal, and the reference signal output terminal Ref outputs a reference signal; under the control of the light emitting control signal, the first light emitting control sub-circuit controls to electrically connect or disconnect the second terminal of the second coupling sub-circuit and the reference signal output terminal Ref, to control whether to transmit the reference signal to the second terminal of the second coupling sub-circuit.

Exemplarily, the writing-in control terminal Sn inputs a writing-in control signal, and the data signal input terminal DA inputs a data signal; under the control of the writing-in control signal, the data writing-in sub-circuit controls to electrically connect or disconnect the second terminal of the second coupling sub-circuit and the data signal input terminal DA, to control whether to transmit the data signal to the second terminal of the second coupling sub-circuit.

Figure 3:
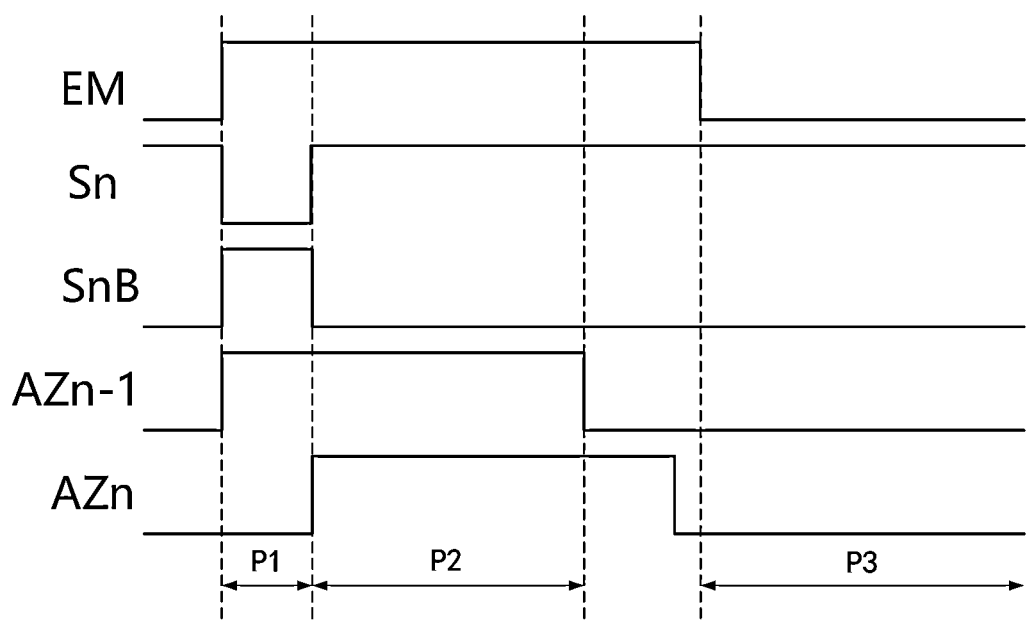
FIG. 3 is a working timing diagram of a pixel driving circuit according to an embodiment of the disclosure.

As shown in FIG. 3, the specific working process of the above-mentioned pixel driving circuit in each display period includes:

In a reset phase P1, under the control of the second control signal outputted by the second control terminal SnB, the first reset sub-circuit controls the electrical connection between the control terminal of the driving sub-circuit and the initialization signal output terminal Init to transmit the initialization signal to the control terminal N1 of the driving sub-circuit, so that the potential of the control terminal N1 of the driving sub-circuit is reset to the potential Vinit of the initialization signal; under the control of the third control signal outputted by the third control terminal AZn−1, the second reset sub-circuit controls to electrically connect the second terminal N2 of the first coupling sub-circuit and the first level signal output terminal VDD, and transmits the first level signal to the second terminal N2 of the first coupling sub-circuit, so that the potential of the second terminal N2 of the first coupling sub-circuit is reset to the potential Vdd of the first level signal; under the control of the writing-in control signal outputted by the writing-in control terminal Sn, the data writing-in sub-circuit controls to electrically connect the second terminal N3 of the second coupling sub-circuit and the data signal input terminal DA, and transmit the data signal to the second terminal N3 of the second coupling sub-circuit, so that the potential of the second terminal N3 of the second coupling sub-circuit becomes the potential Vdata of the data signal.

In a compensation phase P2, under the control of the second control signal outputted by the second control terminal SnB, the first reset sub-circuit controls to disconnect the electric connection between the control terminal of the driving sub-circuit and the initialization signal output terminal Init; under the control of the third control signal outputted by the third control terminal AZn−1, the second reset sub-circuit continues to control to electrically connect the second terminal of the first coupling sub-circuit and the first level signal output terminal VDD, so that the potential of the second terminal N2 of the first coupling sub-circuit is maintained at Vdd; under the control of the writing-in control signal outputted by the writing-in control terminal Sn, the data writing-in sub-circuit controls to disconnect the electric connection between the second terminal of the second coupling sub-circuit and the data signal input terminal DA; under the control of the first control signal outputted by the first control terminal AZn, the compensation sub-circuit controls to electrically connect the control terminal of the driving sub-circuit and the second terminal of the driving sub-circuit; the driving sub-circuit connects the first level signal output terminal VDD and the compensation sub-circuit until the threshold voltage of the driving sub-circuit is written into the control terminal of the driving sub-circuit, so that the potential of the control terminal N1 of the driving sub-circuit is changed to Vdd−|Vth_T3|, and Vth_T3 is the threshold voltage corresponding to the driving sub-circuit.

In a light emitting phase P3, under the control of the second control signal outputted by the second control terminal SnB, the first reset sub-circuit controls to disconnect the electric connection between the control terminal of the driving sub-circuit and the initialization signal output terminal Init; under the control of the third control signal outputted by the third control terminal AZn−1, the second reset sub-circuit controls to disconnect the electric connection between the second terminal of the first coupling sub-circuit and the first level signal output terminal VDD; under the control of the writing-in control signal outputted by the writing-in control terminal Sn, the data writing-in sub-circuit controls to disconnect the electric connection between the second terminal of the second coupling sub-circuit and the data signal input terminal DA; under the control of the first control signal outputted by the first control terminal AZn, the compensation sub-circuit controls to disconnect the electric connection between the control terminal of the driving sub-circuit and the second terminal of the driving sub-circuit; under the control of the light emitting control signal outputted by the light emitting control terminal EM, the first light emitting control sub-circuit controls to electrically connect the second terminal of the second coupling sub-circuit and the reference signal output terminal Ref, so that the potential of the second terminal N3 of the second coupling sub-circuit changes from Vdata to the potential Vref of the reference signal. Since the control terminal N1 of the driving sub-circuit is in the floating state in the light emitting phase P3, the potential of N1 will also have a voltage change of Vref−Vdata, so that the potential of N1 becomes Vdd−|Vth_T3|+Vref−Vdata; the driving sub-circuit connects the first level signal output terminal VDD and the light emitting element EL, and transmits the generated driving signal to the light emitting element EL.

The generated driving signal includes a current signal, and the current signal is:

$$\text{Ioled} = \beta*(Vgs - Vth\_T3)^2 = \beta*(Vref - Vdata)^2$$

β represents a constant, and Vgs represents a gate-source voltage corresponding to the driving sub-circuit.

It can be seen that the driving circuit generated by the pixel driving circuit is irrelevant to the threshold voltage corresponding to the driving sub-circuit.

According to the specific structure and working process of the pixel driving circuit described above, in the pixel driving circuit provided by the embodiment of the present disclosure, the first control signal outputted by the first control terminal AZn and the third control signal outputted by the third control terminal AZn-1 each has an adjustable pulse width. Therefore, the threshold voltage compensation time can be adjusted by adjusting the pulse width of the first control signal and the third control signal, thereby reducing mura caused by the short compensation time under high frequency conditions. Moreover, through the compensation sub-circuit, the first reset sub-circuit and the second reset sub-circuit, the potentials of the control terminal N1 of the driving sub-circuit and the second terminal N2 of the first coupling sub-circuit is well maintained in the light emitting phase P3 under the low-frequency condition; therefore, when the pixel driving circuit provided by the embodiment of the present disclosure is applied to a display device, the display device can be effectively compatible with high-frequency display and low-frequency display, to meet people's needs for high refresh rate and low power consumption functions.

It should be noted that when the pixel driving circuit provided in the embodiment of the present disclosure is applied to a display device, the pixel driving circuit provided in the embodiment of the present disclosure can support the display device to realize display in a refresh frequency of 1 Hz to 120 Hz.

As shown in FIG. 1, in some embodiments, the pixel driving circuit further includes:

A second light emitting control sub-circuit, the second terminal of the driving sub-circuit is coupled to the light emitting element EL through the second light emitting control sub-circuit; the second light emitting control sub-circuit is respectively coupled to the light emitting control terminal EM, the second terminal of the driving sub-circuit and the light emitting element EL; configured to control to electrically connect or disconnect the second terminal of the driving sub-circuit and the light emitting element EL under the control of the light emitting control terminal EM;

A third reset sub-circuit, respectively coupled to the first control terminal AZn, the light emitting element EL and the initialization signal output terminal Init; configured to control to electrically connect or disconnect the light emitting element EL and the initialization signal output terminal Init under the control of the first control terminal AZn.

Exemplarily, under the control of the light emitting control signal outputted by the light emitting control terminal EM, the second light emitting control sub-circuit controls to electrically connect or disconnect the second terminal of the driving sub-circuit and the light emitting element EL, to control whether to transmit the driving signal generated by the driving sub-circuit to the light emitting element EL.

Exemplarily, under the control of the first control signal outputted by the first control terminal AZn, the third reset sub-circuit controls to electrically connect or disconnect the light emitting element EL and the initialization signal output terminal Init, to control whether to transmit the initialization signal to the anode of the light emitting element EL.

The driving method further includes:

In the reset phase P1, under the control of the light emitting control signal, the second light emitting control sub-circuit controls to disconnect the electric connection between the second terminal of the driving sub-circuit and the light emitting element EL; under the control of the first control signal, the third reset sub-circuit controls to disconnect the electric connection between the light emitting element EL and the initialization signal output terminal Init.

In the compensation phase P2, under the control of the light emitting control signal, the second light emitting control sub-circuit controls to disconnect the electric connection between the second terminal of the driving sub-circuit and the light emitting element EL; under the control of the first control signal, the third reset sub-circuit controls to electrically connect the light emitting element EL and the initialization signal output terminal Init, to reset the potential of the anode N5 of the light emitting element EL to Vinit.

In the light emitting phase P3, under the control of the light emitting control signal, the second light emitting control sub-circuit controls to electrically connect the second terminal of the driving sub-circuit and the light emitting element EL; under the control of the first control signal, the third reset sub-circuit controls to disconnect the electric connection between the light emitting element EL and the initialization signal output terminal Init.

In the pixel driving circuit provided by the foregoing embodiment, by providing the second light emitting control sub-circuit and the third reset sub-circuit, the abnormal light emitting of the light emitting element EL can be avoided, and the display quality of the display device can be ensured. Moreover, by coupling the third reset sub-circuit and the compensation sub-circuit to the first control terminal AZn, the structure of the gate driving circuit GOA in the display device can effectively simplified.

As shown in FIG. 11, in some embodiments, the pixel driving circuit further includes:

A second light emitting control sub-circuit, the second terminal of the driving sub-circuit is coupled to the light emitting element EL through the second light emitting control sub-circuit; the second light emitting control sub-circuit is respectively connected to the light emitting control terminal EM, the second terminal of the driving sub-circuit and the light emitting element EL; configured to control to electrically connect or disconnect the second terminal of the driving sub-circuit and the light emitting element EL under the control of the light emitting control terminal EM;

A fourth reset sub-circuit, respectively coupled to the writing-in control terminal Sn, the light emitting element EL and the initialization signal output terminal Init; configured to control to electrically connect or disconnect the light emitting element EL and the initialization signal output terminal Init under the control of the writing-in control terminal Sn.

Exemplarily, under the control of the light emitting control signal outputted by the light emitting control terminal EM, the second light emitting control sub-circuit controls to electrically connect or disconnect the second terminal of the driving sub-circuit and the light emitting element EL, to control whether to transmit the driving signal generated by the driving sub-circuit to the light emitting element EL.

Exemplarily, under the control of the writing-in control signal outputted by the writing-in control terminal Sn, the fourth reset sub-circuit controls to electrically connect or disconnect the light emitting element EL and the initialization signal output terminal Init, to control whether to transmit the initialization signal to the anode of the light emitting element EL.

The driving method further includes:

In the reset phase P1, under the control of the light emitting control signal, the second light emitting control sub-circuit controls to disconnect the electric connection between the electric connection between the second terminal of the driving sub-circuit and the light emitting element EL; under the control of the writing-in control signal, the fourth reset sub-circuit controls to electrically connect the light emitting element EL and the initialization signal output terminal Init, to reset the potential of the anode N5 of the light emitting element EL to Vinit;

In the compensation phase P2, under the control of the light emitting control signal, the second light emitting control sub-circuit controls to disconnect the electric connection between the electric connection between the second terminal of the driving sub-circuit and the light emitting element EL; under the control of the writing-in control signal, the fourth reset sub-circuit controls to disconnect the electric connection between the electric connection between the light emitting element EL and the initialization signal output terminal Init;

In the light emitting phase P3, under the control of the light emitting control signal, the second light emitting control sub-circuit controls to electrically connect the second terminal of the driving sub-circuit and the light emitting element EL; under the control of the writing-in control signal, the fourth reset sub-circuit controls to disconnect the electric connection between the electric connection between the light emitting element EL and the initialization signal output terminal Init.

In the pixel driving circuit provided by the foregoing embodiment, by providing the second light emitting control sub-circuit and the third reset sub-circuit, the abnormal light emitting of the light emitting element EL can be avoided, and the display quality of the display device can be ensured. Moreover, the fourth reset sub-circuit and the data writing-in sub-circuit are both coupled to the writing-in control terminal Sn, which can effectively simplify the structure of the gate driving sub-circuit circuit GOA in the display device and reduce the layout space occupied by the pixel driving circuit.

Figure 2:
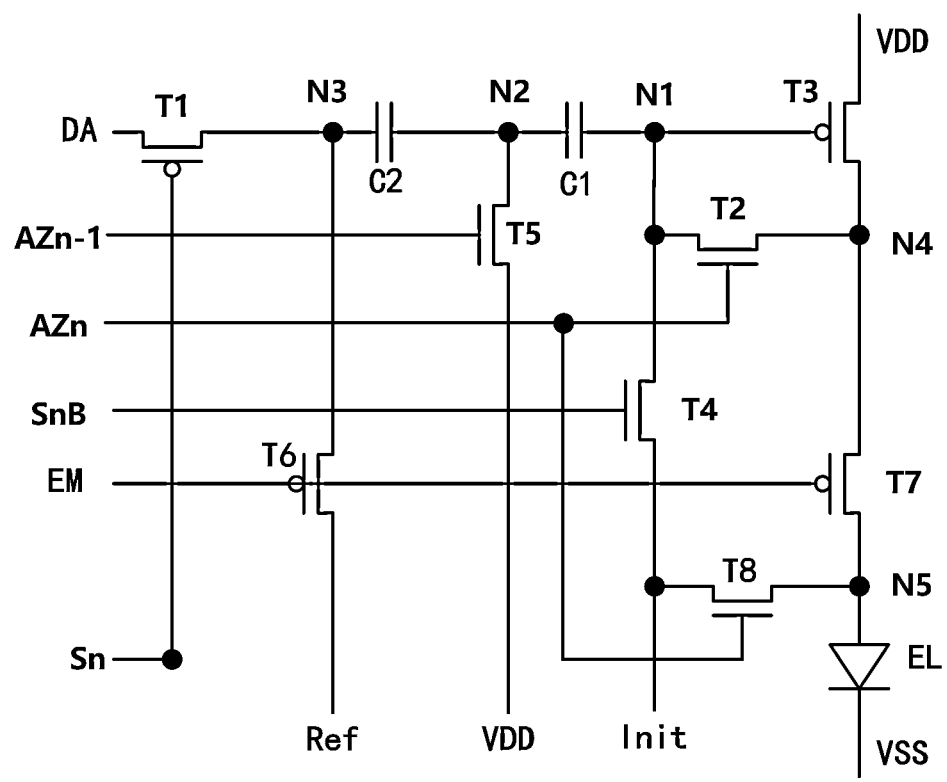
FIG. 2 is a schematic diagram of a first specific structure of a pixel driving circuit according to an embodiment of the disclosure.
Figure 12:
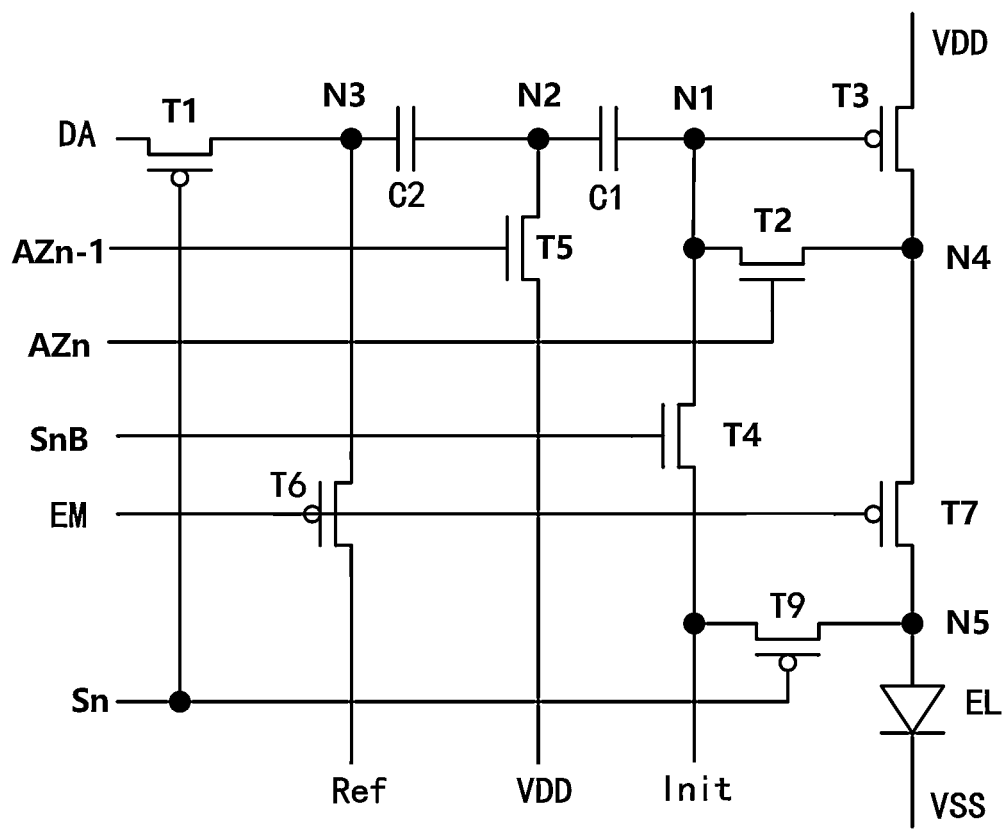
FIG. 12 is a schematic diagram of a second specific structure of a pixel driving circuit according to an embodiment of the disclosure.

As shown in FIGS. 2 and 12, in some embodiments, the data writing-in sub-circuit includes a first transistor T1, the compensation sub-circuit includes a second transistor T2, and the driving sub-circuit includes a third transistor T3, the first reset sub-circuit includes a fourth transistor T4, the second reset sub-circuit includes a fifth transistor T5, the first light emitting control sub-circuit includes a sixth transistor T6, and the first coupling sub-circuit includes a first Capacitor C1, the second coupling sub-circuit includes a second capacitor C2;

A gate electrode of the first transistor T1 is coupled to the writing-in control terminal Sn, a first electrode of the first transistor T1 is coupled to the data signal input terminal DA, and a second electrode of the first transistor T1 is coupled to a second terminal of the second capacitor C2;

A gate electrode of the second transistor T2 is coupled to the first control terminal AZn, a first electrode of the second transistor T2 is coupled to a second electrode of the third transistor T3, and a second electrode of the second transistor T2 is coupled to a gate electrode of the third transistor T3;

A first electrode of the third transistor T3 is coupled to the first level signal output terminal VDD;

A gate electrode of the fourth transistor T4 is coupled to the second control terminal SnB, a first electrode of the fourth transistor T4 is coupled to the initialization signal output terminal Init, and a second electrode of the fourth transistor T4 is coupled to the gate electrode of the third transistor T3;

A gate electrode of the fifth transistor T5 is coupled to the third control terminal AZn−1, a first electrode of the fifth transistor T5 is coupled to the first level signal output terminal VDD, and a second electrode of the fifth transistor T5 is coupled to a second terminal of the first capacitor C1;

A gate electrode of the sixth transistor T6 is coupled to the light emitting control terminal EM, a first electrode of the sixth transistor T6 is coupled to the reference signal output terminal Ref, and a second electrode of the sixth transistor T6 is coupled to the second terminal of the second capacitor C2;

A first terminal of the first capacitor C1 is coupled to the gate electrode of the third transistor T3;

A first terminal of the second capacitor C2 is coupled to the second terminal of the first capacitor C1.

As shown in FIGS. 2 and 12, in some embodiments, the first transistor T1, the third transistor T3, and the sixth transistor T6 all include P-type low-temperature polysilicon transistors, and the second transistor T2, the fourth transistor T4 and the fifth transistor T5 include N-type oxide transistors.

As shown in FIG. 3, when the pixel driving circuit adopts the above structure, the specific working process of the pixel driving circuit is as follows:

In the reset phase P1, the light emitting control signal is at a high level, the writing-in control signal is at a low level, the second control signal is at a high level, and the third control signal is at a high level. The first control signal is at a low level; the first transistor T1 is turned on, the fourth transistor T4 is turned on, and the fifth transistor T5 is turned on.

In the compensation phase P2, the light emitting control signal is at a high level, the writing-in control signal is at a high level, the second control signal is at a low level, and the third control signal is at a high level. The first control signal is at a high level; the second transistor T2 is turned on, the third transistor T3 is turned on, and the fifth transistor T5 is turned on.

In the light emitting phase P3, the light emitting control signal is at a low level, the writing-in control signal is at a high level, the second control signal is at a low level, and the third control signal is at a low level. The first control signal is at a low level; the sixth transistor T6 is turned on.

As shown in FIG. 1 and FIG. 2, in some embodiments, the second light emitting control sub-circuit includes a seventh transistor T7, and a gate electrode of the seventh transistor T7 is coupled to the light emitting control terminal EM. A first electrode of the seventh transistor T7 is coupled to the second terminal of the driving sub-circuit, and a second electrode of the seventh transistor T7 is coupled to the light emitting element EL;

The third reset sub-circuit includes an eighth transistor T8, a gate electrode of the eighth transistor T8 is coupled to the first control terminal AZn, and a first electrode of the eighth transistor T8 is coupled to the initialization signal output terminal Init, and a second electrode of the eighth transistor T8 is coupled to the light emitting element EL.

Exemplarily, the seventh transistor T7 includes a P-type low-temperature polysilicon transistor, and the eighth transistor T8 includes an N-type oxide transistor.

In the reset phase P1, the seventh transistor T7 and the eighth transistor T8 are both turned off.

In the compensation phase P2, the seventh transistor T7 is turned off, and the eighth transistor T8 is turned on.

In the light emitting phase P3, the seventh transistor T7 is turned on, and the eighth transistor T8 is turned off.

The pixel driving circuit provided by the above embodiments adopts an 8T2C (i.e., eight transistors and two capacitors) structure. When the pixel driving circuit is applied to a display device, the display device can be well compatible with high-frequency driving display and low-frequency driving display. Moreover, the second transistor T2, the fourth transistor T4, the fifth transistor T5, and the eighth transistor T8 adopt N-type oxide thin film transistors with a small leakage current, the leakage of key nodes (such as: N1, N2, N5) in the pixel circuit is effectively reduced, the maintenance of the potential at the key node during low-frequency display is ensured; at the same time, the first transistor T1, the third transistor T3, the sixth transistor T6, and the seventh transistor T7 are all P-type low-temperature polysilicon thin film transistor, which ensures the driving current for pixel driving circuit compensation and data writing-in, and realizes data writing-in and threshold voltage compensation under high refresh frequency.

In addition, by setting the eighth transistor T8 to be an N-type oxide thin film transistor, the node N5 can be quickly discharged to improve the contrast of the display device.

As shown in FIG. 11 and FIG. 12, in some embodiments, the second light emitting control sub-circuit includes a seventh transistor T7, and a gate electrode of the seventh transistor T7 is coupled to the light emitting control terminal EM, a first electrode of the seventh transistor T7 is coupled to the second terminal of the driving sub-circuit, and a second electrode of the seventh transistor T7 is coupled to the light emitting element EL;

The fourth reset sub-circuit includes a ninth transistor T9, a gate electrode of the ninth transistor T9 is coupled to the writing-in control terminal Sn, and a first electrode of the ninth transistor T9 is coupled to the initialization signal output terminal Init, and the second electrode of the ninth transistor T9 is coupled to the light emitting element EL.

Exemplarily, the seventh transistor T7 and the ninth transistor T9 both include P-type low-temperature polysilicon transistors.

In the reset phase P1, the seventh transistor T7 is turned off, and the ninth transistor T9 is turned on.

In the compensation phase P2, the seventh transistor T7 is turned off, and the ninth transistor T9 is turned off.

In the light emitting phase P3, the seventh transistor T7 is turned on, and the ninth transistor T9 is turned off.

The pixel driving circuit provided by the above embodiments adopts an 8T2C structure. When the pixel driving circuit is applied to a display device, the display device can be well compatible with high-frequency driving display and low-frequency driving display. Moreover, the second transistor T2, the fourth transistor T4, the fifth transistor T5 adopt N-type oxide thin film transistors with a small leakage current, the leakage of key nodes (such as: N1, N2) in the pixel circuit is effectively reduced, the maintenance of the potential at the key node during low-frequency display is ensured; at the same time, the first transistor T1, the third transistor T3, the sixth transistor T6, and the seventh transistor T7 and the ninth transistor T9 are all P-type low-temperature polysilicon thin film transistor, which ensures the driving current for pixel driving circuit compensation and data writing-in, and realizes data writing-in and threshold voltage compensation under high refresh frequency.

As shown in FIGS. 1, 3, and 11, embodiments of the present disclosure also provide a driving method of a pixel driving circuit, and the driving method includes: within each display period, In the reset phase P1, under the control of the second control terminal SnB, the first reset sub-circuit controls to electrically connect the control terminal of the driving sub-circuit and the initialization signal output terminal Init; under the control of the third control terminal AZn−1, the second reset sub-circuit controls to electrically connect the second terminal of the first coupling sub-circuit and the first level signal output terminal VDD; under the control of the writing-in control terminal Sn, the data writing-in sub-circuit controls to electrically connect the second terminal of the second coupling sub-circuit and the data signal input terminal DA;

In the compensation phase P2, under the control of the second control terminal SnB, the first reset sub-circuit controls to disconnect the electric connection between the electric connection between the control terminal of the driving sub-circuit and the initialization signal output terminal Init; under the control of the third control terminal AZn−1, the second reset sub-circuit continues to control to electrically connect the second terminal of the first coupling sub-circuit and the first level signal output terminal VDD; under the control of the writing-in control terminal Sn, the data writing-in sub-circuit controls to disconnect the electric connection between the electric connection between the second terminal of the second coupling sub-circuit and the data signal input terminal DA; under the control of the first control terminal AZn, the compensation sub-circuit controls to electrically connect the control terminal of the driving sub-circuit and the second terminal of the driving sub-circuit; the driving sub-circuit connects the first level signal output terminal VDD and the compensation sub-circuit until the threshold voltage of the driving sub-circuit is written into the control terminal of the driving sub-circuit;

In the light emitting phase P3, under the control of the second control terminal SnB, the first reset sub-circuit controls to disconnect the electric connection between the electric connection between the control terminal of the driving sub-circuit and the initialization signal output terminal Init; under the control of the third control terminal AZn−1, the second reset sub-circuit controls to disconnect the electric connection between the electric connection between the second terminal of the first coupling sub-circuit and the first level signal output terminal VDD; under the control of the writing-in control terminal Sn, the data writing-in sub-circuit controls to disconnect the electric connection between the electric connection between the second terminal of the second coupling sub-circuit and the data signal input terminal DA; under the control of the first control terminal AZn, the compensation sub-circuit controls to disconnect the electric connection between the control terminal of the driving sub-circuit and the second terminal of the driving sub-circuit; under the control of the light emitting control terminal EM, the first light emitting control sub-circuit controls to electrically connect the second terminal of the second coupling sub-circuit and the reference signal output terminal Ref; the driving sub-circuit connects the first level signal output terminal VDD and the light emitting element EL, and transmits the generated driving signal to the light emitting element EL.

When the driving method provided by the embodiment of the present disclosure is used to drive the above-mentioned pixel driving circuit, the pulse widths of the first control signal outputted by the first control terminal AZn and the third control signal outputted by the third control terminal AZn−1 are both adjustable, therefore, the threshold voltage compensation time can be adjusted by adjusting the pulse width of the first control signal and the third control signal, so as to reduce the mura problem caused by the short compensation time under high frequency conditions; moreover, through the compensation sub-circuit, the first reset sub-circuit and the second reset sub-circuit, the potentials of the control terminal N1 of the driving sub-circuit and the second terminal N2 of the first coupling sub-circuit are well maintained in the light emitting phase P3 under low frequency conditions; therefore, when the pixel driving circuit is applied to a display device, the display device can be effectively compatible with high-frequency display and low-frequency display, and meet people's demand for high refresh frequency and low power consumption.

As shown in FIGS. 1 and 3, in some embodiments, in the case that the pixel driving circuit further includes a second light emitting control sub-circuit and a third reset sub-circuit, the driving method further includes:

In the reset phase P1, under the control of the light emitting control terminal EM, the second light emitting control sub-circuit controls to disconnect the electric connection between the second terminal of the driving sub-circuit and the light emitting element EL; under the control of the first control terminal AZn, the third reset sub-circuit controls to disconnect the electric connection between the light emitting element EL and the initialization signal output terminal Init;

In the compensation phase P2, under the control of the light emitting control terminal EM, the second light emitting control sub-circuit controls to disconnect the electric connection between the second terminal of the driving sub-circuit and the light emitting element EL; under the control of the first control terminal AZn, the third reset sub-circuit controls to electrically connect the light emitting element EL and the initialization signal output terminal Init;

In the light emitting phase P3, under the control of the light emitting control terminal EM, the second light emitting control sub-circuit controls to electrically connect the second terminal of the driving sub-circuit and the light emitting element EL; under the control of the first control terminal AZn, the third reset sub-circuit controls to disconnect the electric connection between the light emitting element EL and the initialization signal output terminal Init.

As shown in FIGS. 3 and 11, in some embodiments, when the pixel driving circuit further includes a second light emitting control sub-circuit and a fourth reset sub-circuit, the driving method further includes:

In the reset phase P1, under the control of the light emitting control terminal EM, the second light emitting control sub-circuit controls to disconnect the electric connection between the second terminal of the driving sub-circuit and the light emitting element EL; under the control of the writing-in control terminal Sn, the fourth reset sub-circuit controls to electrically connect the light emitting element EL and the initialization signal output terminal Init;

In the compensation phase P2, under the control of the light emitting control terminal EM, the second light emitting control sub-circuit controls to disconnect the electric connection between the second terminal of the driving sub-circuit and the light emitting element EL; under the control of the writing-in control terminal Sn, the fourth reset sub-circuit controls to disconnect the electric connection between the light emitting element EL and the initialization signal output terminal Init;

In the light emitting phase P3, under the control of the light emitting control terminal EM, the second light emitting control sub-circuit controls to electrically connect the second terminal of the driving sub-circuit and the light emitting element EL; under the control of the writing-in control terminal Sn, the fourth reset sub-circuit controls to disconnect the electric connection between the light emitting element EL and the initialization signal output terminal Init.

Figure 4:
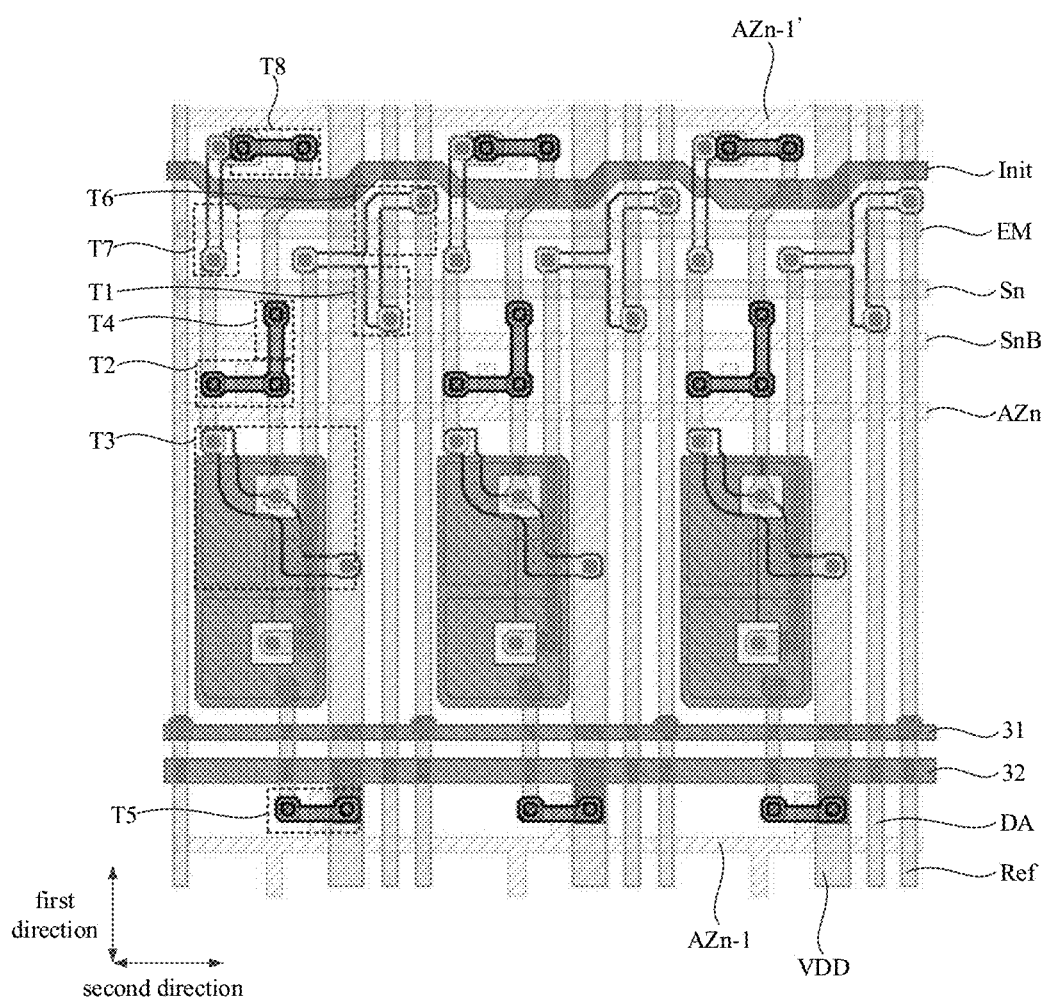
FIG. 4 is a schematic diagram of a first layout of a pixel driving circuit according to an embodiment of the disclosure.
Figure 13:
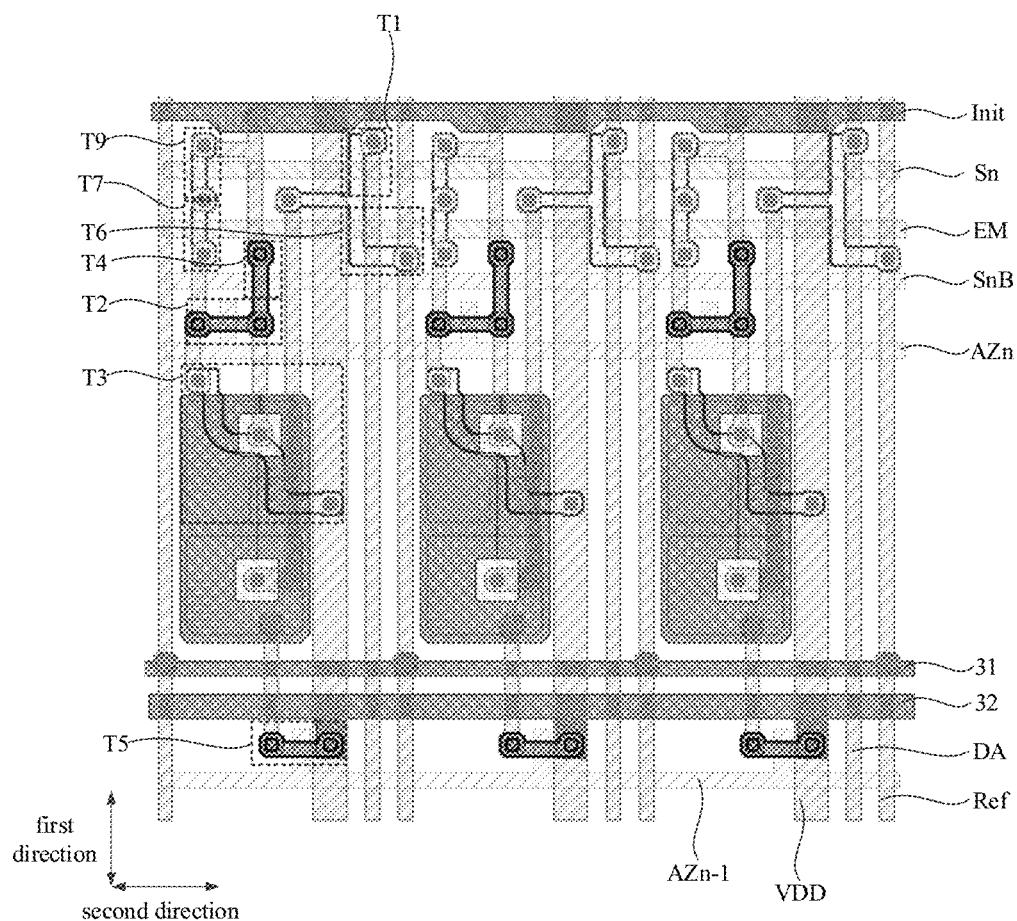
FIG. 13 is a schematic diagram of a second layout of a pixel driving circuit according to an embodiment of the disclosure.

As shown in FIG. 4 and FIG. 13, an embodiment of the present disclosure also provides a display substrate, including a substrate and a plurality of sub-pixels arranged in an array on the substrate; the plurality of sub-pixels include the pixel driving circuit provided in the above embodiments, the sub-pixel further includes:

A power line pattern, at least part of the power line pattern extending along a first direction, and the power line pattern being multiplexed as a first level signal output terminal VDD;

A data line pattern, at least part of the data line pattern extending along the first direction, and the data line pattern being multiplexed as a data signal input terminal DA;

A reference signal line pattern, at least part of the reference signal line pattern extending along the first direction, the reference signal line pattern being multiplexed as a reference signal output terminal Ref; the data line pattern being located between the power line pattern and the reference signal line pattern;

A first control signal line pattern, at least part of the first control signal line pattern extending in a second direction, the second direction intersecting the first direction, and the first control signal line pattern being multiplexed as a first control terminal AZn coupled to the compensation sub-circuit in the pixel driving circuit;

A second control signal line pattern, at least part of the second control signal line pattern extending along the second direction, and the second control signal line pattern being multiplexed as a second control terminal SnB;

A third control signal line pattern, at least part of the third control signal line pattern extending along the second direction, and the third control signal line pattern being multiplexed into a third control terminal AZn−1;

An initialization signal line pattern, at least part of the initialization signal line pattern extending along the second direction, and the initialization signal line pattern being multiplexed as an initialization signal output terminal Init;

A light emitting control signal line pattern, at least part of the light emitting control signal line pattern extending along the second direction, and the light emitting control signal line pattern being multiplexed as a light emitting control terminal EM;

A data writing-in control line pattern, at least part of the data writing-in control line pattern extending along the second direction, and the data writing-in control line pattern being multiplexed as a writing-in control terminal Sn.

Exemplarily, the plurality of sub-pixels are arranged in an array on the substrate, and the plurality of sub-pixels can be divided into a plurality of rows of sub-pixels arranged in a first direction, and each row of sub-pixels includes a plurality of sub-pixels arranged in a second direction; the plurality of sub-pixels can be divided into a plurality of columns of sub-pixels arranged along the second direction, and each column of sub-pixels includes a plurality of sub-pixels arranged along the first direction.

Exemplarily, in the same column of sub-pixels, the power line patterns included in the plurality of sub-pixel are sequentially coupled to form an integrated structure; in the same column of sub-pixels, the data line patterns included in the plurality of sub-pixel are sequentially coupled to form an integrated structure; in the same column of sub-pixels, the reference signal line patterns included in the plurality of sub-pixel are sequentially coupled to form an integrated structure.

Exemplarily, in the same row of sub-pixels, the first control signal line patterns included in the plurality of sub-pixel are sequentially coupled to form an integrated structure; in the same row of sub-pixels, the second control signal line patterns included in the plurality of sub-pixel are sequentially coupled to form an integrated structure; in the same row of sub-pixels, the third control signal line patterns included in the plurality of sub-pixel are sequentially coupled to form an integrated structure; in the same row of sub-pixels, initialization signal line patterns included in the plurality of the sub-pixels are sequentially coupled to form an integrated structure; in the same row of sub-pixels, the light emitting control signal line patterns included in the plurality of sub-pixel are sequentially coupled to form an integrated structure; in the same row of sub-pixels, the data writing-in control line patterns included in the plurality of sub-pixels are sequentially coupled to form an integrated structure.

Exemplarily, the power line pattern is multiplexed as a first level signal output terminal VDD, and the driving sub-circuit and the second reset sub-circuit are both coupled to the power line pattern.

Exemplarily, the data line pattern is multiplexed as a data signal input terminal DA, and the data writing-in sub-circuit is coupled to the data line pattern.

Exemplarily, the reference signal line pattern is multiplexed as a reference signal output terminal Ref, and the first light emitting control sub-circuit is coupled to the reference signal line pattern.

Exemplarily, the first control signal line pattern is multiplexed as the first control terminal AZn coupled to the compensation sub-circuit in the pixel driving circuit. In the same sub-pixel, the compensation sub-circuit is coupled to the first control signal line pattern.

Exemplarily, the second control signal line pattern is multiplexed as a second control terminal SnB, and the first reset sub-circuit is coupled to the second control signal line pattern.

Exemplarily, the third control signal line pattern is multiplexed as a third control terminal AZn−1, and the second reset sub-circuit is coupled to the third control signal line pattern.

Exemplarily, the initialization signal line pattern is multiplexed as an initialization signal output terminal Init, and the first reset sub-circuit and the third reset sub-circuit are coupled to the initialization signal line pattern.

Exemplarily, the light emitting control signal line pattern is multiplexed as the light emitting control terminal EM, and the first light emitting control sub-circuit and the second light emitting control sub-circuit are both coupled to the light emitting control signal line pattern.

Exemplarily, the data writing-in control line pattern is multiplexed as a writing-in control terminal Sn, and the data writing-in sub-circuit is coupled to the data writing-in control line pattern.

Figure 20:
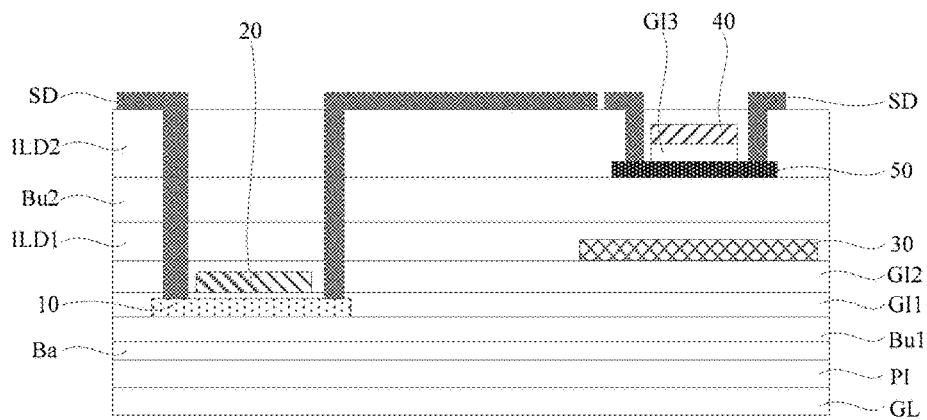
FIG. 20 is a schematic cross-sectional view of each film layer in a display substrate according to an embodiment of the disclosure.

As shown in FIG. 20, exemplarily, the display substrate includes a polyimide layer (PI layer), a barrier layer Ba, a first buffer layer Bu1, a first active layer 10, a first gate insulating layer GI1, a first gate metal layer 20, a second gate insulating layer GI2, a second gate metal layer 30, a first interlayer insulating layer ILD1, a second buffer layer Bu2, a second active layer 50, a third gate insulating layer GI3, a third gate metal layer 40, a second interlayer insulating layer ILD2, a first source-drain metal layer SD, a planarization layer, an anode layer, an organic light emitting function layer and a cathode layer sequentially stacked in a direction away from the substrate GL.

Figure 5:
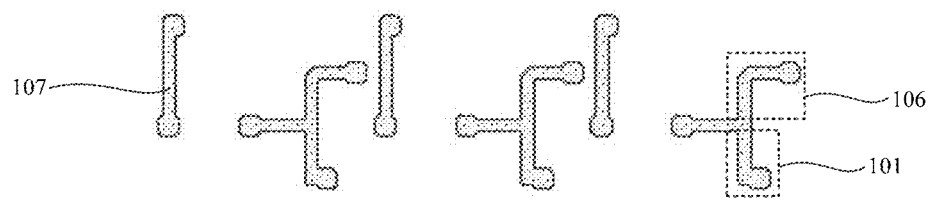
FIG. 5 is a schematic diagram of a layout of the first active layer in FIG. 4.
Figure 5:
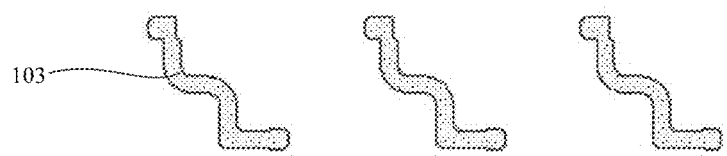
Figure 14:
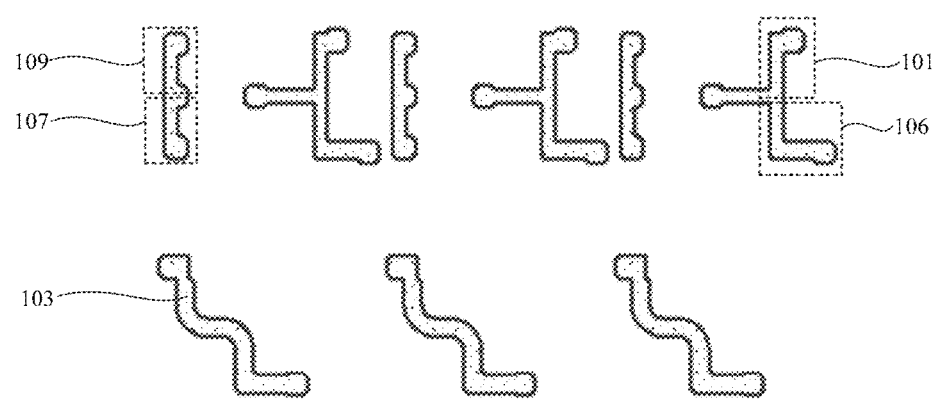
FIG. 14 is a schematic diagram of the layout of the first active layer in FIG. 13.

As shown in FIG. 5, FIG. 14 and FIG. 20, for example, the first active layer 10 is made of P—Si material, and the first active layer 10 includes active patterns in a first transistor T1, a third transistor T3 and a sixth transistor T6.

Figure 6:
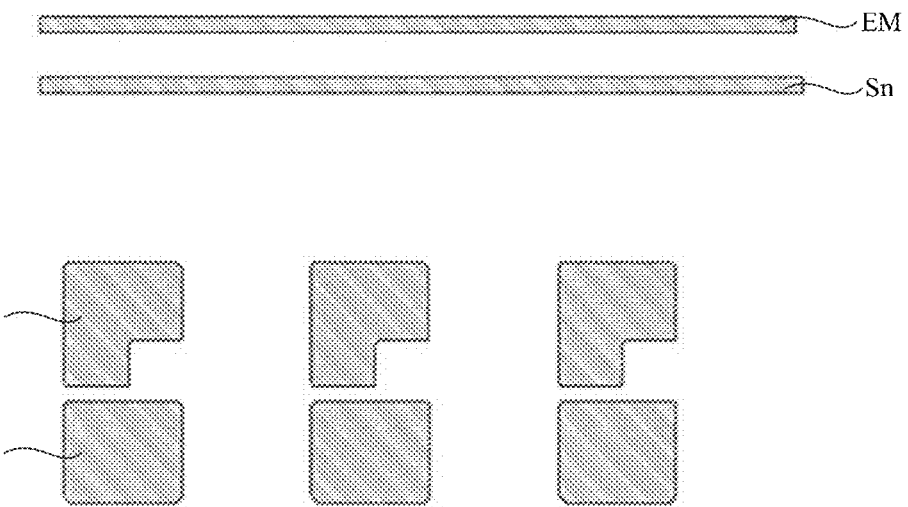
FIG. 6 is a schematic diagram of a layout of a first gate metal layer in FIG. 4.
Figure 15:
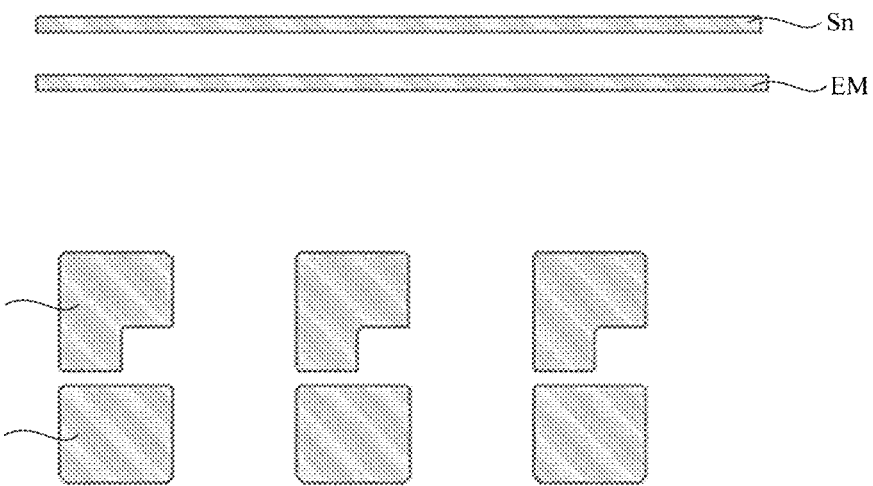
FIG. 15 is a schematic diagram of the layout of the first gate metal layer in FIG. 13.

As shown in FIG. 6, FIG. 15 and FIG. 20, for example, the first gate metal layer 20 includes a light emitting control signal line pattern, a data writing-in control line pattern, a gate electrode of the third transistor T3, a first electrode plate C11 of a first capacitor C1 and a second electrode plate C22 of the second capacitor C2 (that is, the second terminal of the second capacitor C2).

Figure 7:
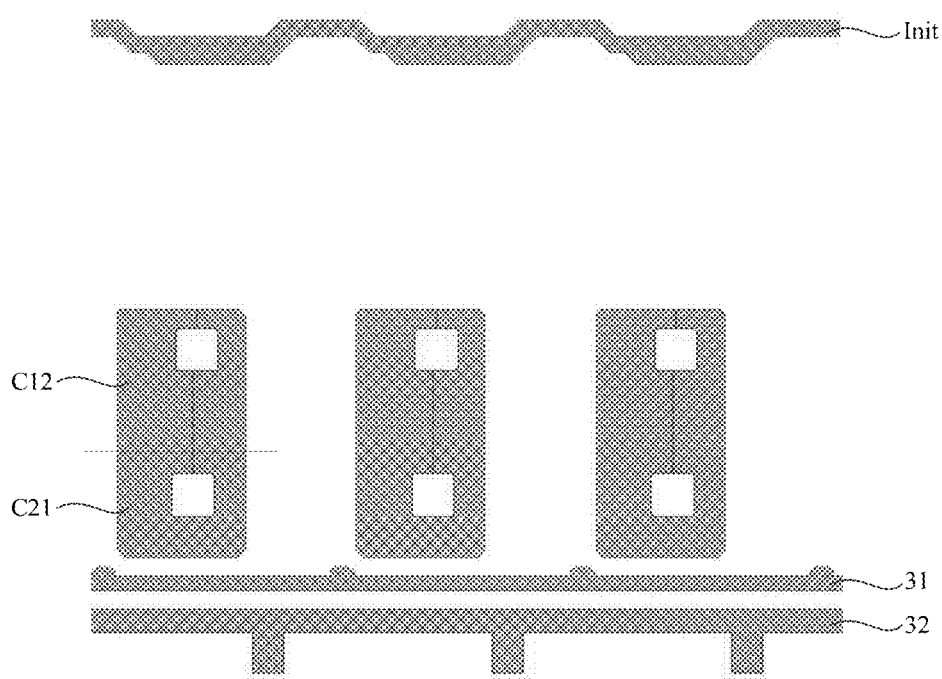
FIG. 7 is a schematic diagram of a layout of a second gate metal layer in FIG. 4.
Figure 16:
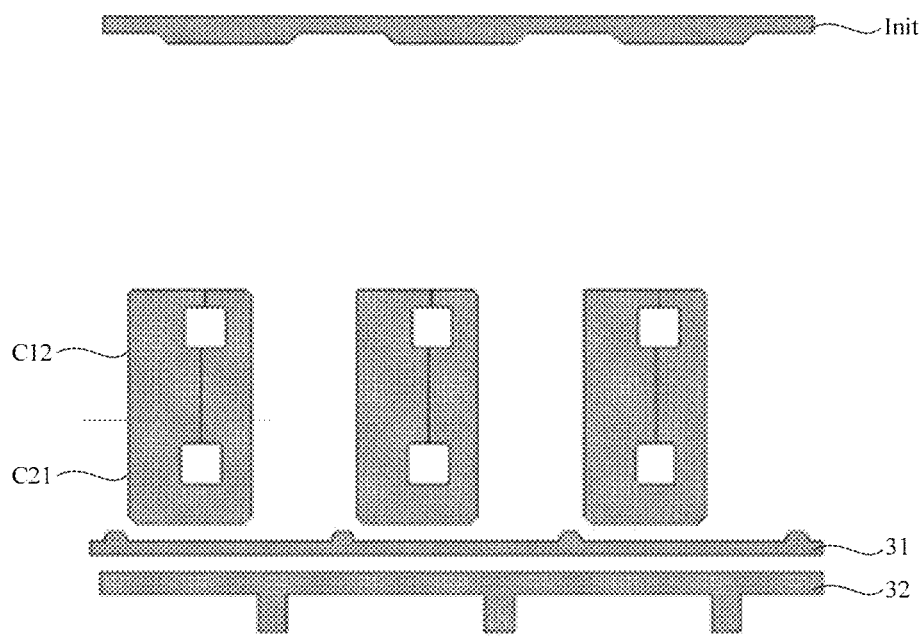
FIG. 16 is a schematic diagram of the layout of the second gate metal layer in FIG. 13.

As shown in FIG. 7, FIG. 16 and FIG. 20, for example, the second gate metal layer 30 includes an initialization signal line pattern, a second electrode plate C12 of the first capacitor C1, a first electrode plate C21 of the second capacitor C2, a first compensation line 31 and a second compensation line 32. Exemplarily, the second electrode plate C12 of the first capacitor C1 and the first electrode plate C21 of the second capacitor C2 are formed as an integral structure.

It should be noted that the second compensation line 32 is used to couple the power line patterns in different sub-pixels together, which is beneficial to improve the uniformity of the power signal.

Figure 8:
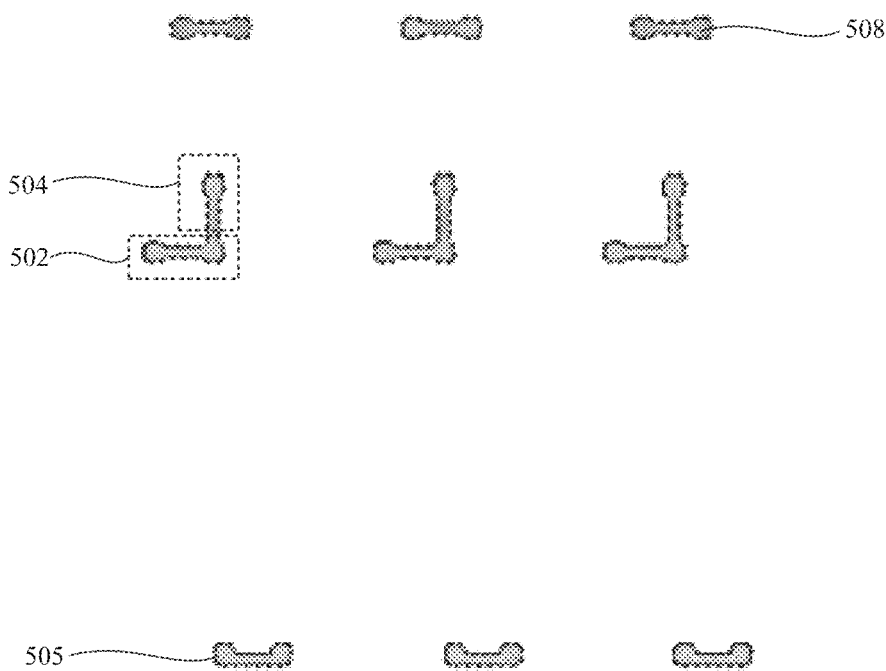
FIG. 8 is a schematic diagram of a layout of a second active layer in FIG. 4.
Figure 17:
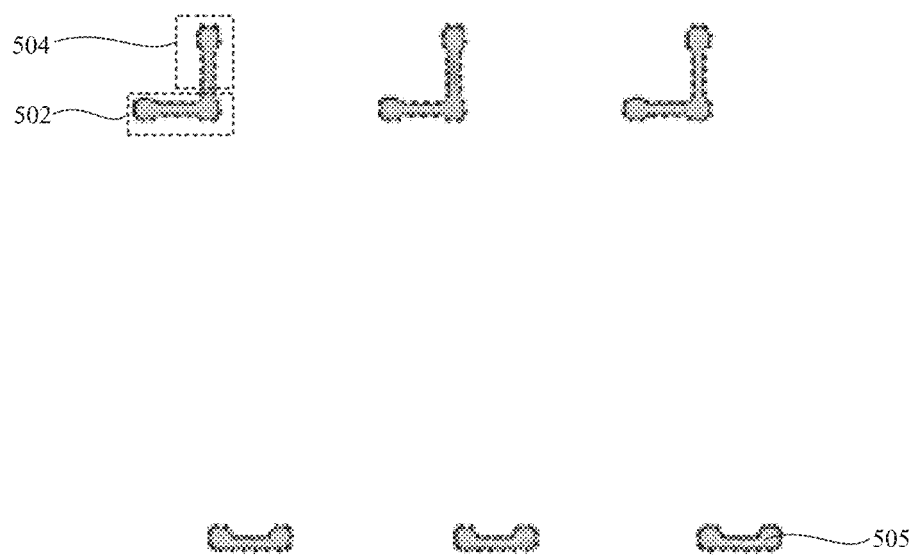
FIG. 17 is a schematic diagram of the layout of the second active layer in FIG. 13.

As shown in FIGS. 8, 17 and 20, for example, the second active layer 50 is made of IGZO material, and the second active layer 50 includes active patterns in a second transistor T2, a fourth transistor T4, and a fifth transistor T5.

Figure 9:
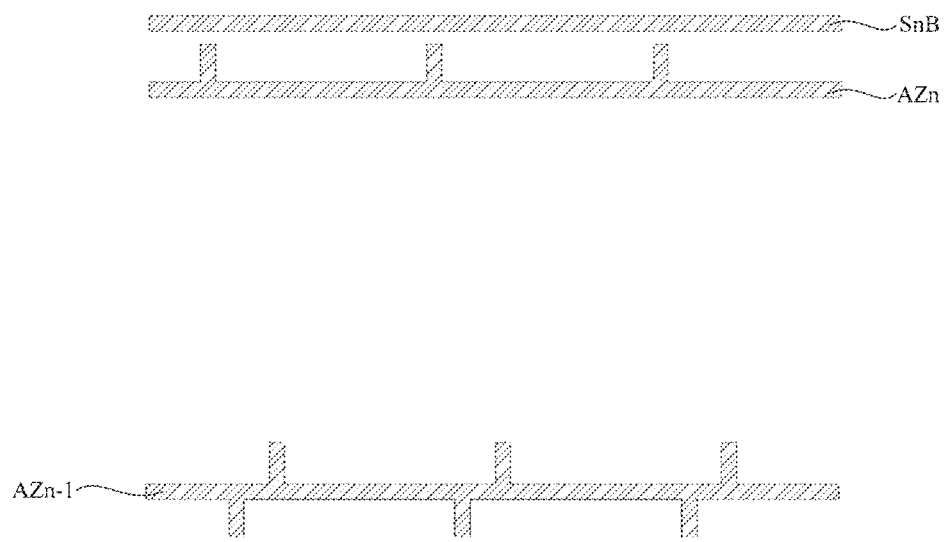
FIG. 9 is a schematic diagram of a layout of a third gate metal layer in FIG. 4.
Figure 18:
FIG. 18 is a schematic diagram of the layout of the third gate metal layer in FIG. 13.

As shown in FIGS. 9, 18 and 20, for example, the third gate metal layer 40 includes a first control signal line pattern, a second control signal line pattern, a third control signal line pattern, and a gate electrode of the second transistor T2 and a gate electrode of the fifth transistor T5.

Figure 10:
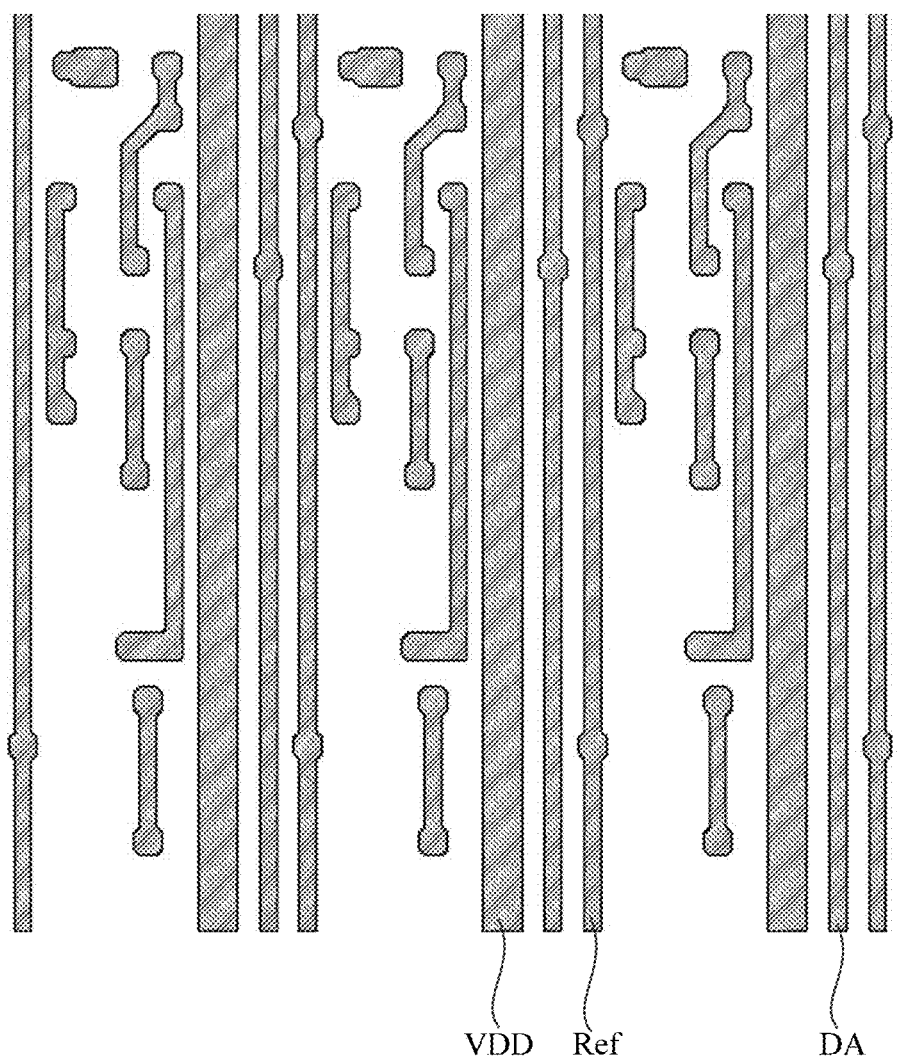
FIG. 10 is a schematic diagram of a layout of a source-drain metal layer in FIG. 4.
Figure 19:
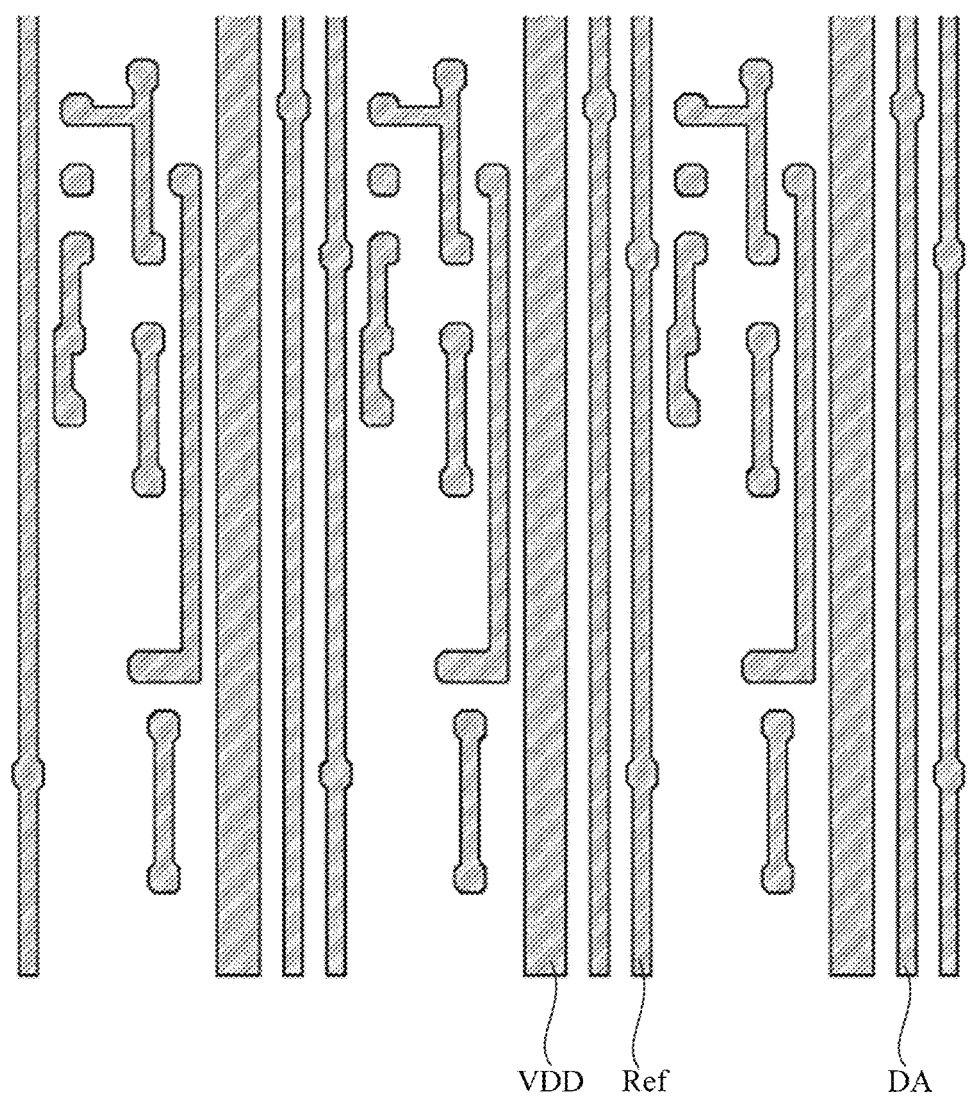
FIG. 19 is a schematic diagram of the layout of the source-drain metal layer in FIG. 13.

As shown in FIG. 10, FIG. 19 and FIG. 20, exemplarily, the first source-drain metal layer includes a power line pattern, a data line pattern, a reference signal line pattern, and some conductive connection parts with conductive functions.

In the display substrate provided by the embodiment of the present disclosure, by arranging the data line pattern between the power line pattern and the reference signal line pattern, it is better to avoid the problem that the change of the data signal transmitted on the data line pattern interferes with the stability of the surrounding transistors.

In addition, since in the pixel driving circuit provided by the above-mentioned embodiment, the pulse widths of the first control signal outputted by the first control terminal AZn and the third control signal outputted by the third control terminal AZn−1 are adjustable, therefore, the pulse widths of the first control signal and the third control signal are adjusted to realize the adjustment of the threshold voltage compensation time, thereby reducing the mura problem caused by the short compensation time under high frequency conditions; moreover, through the compensation sub-circuit, the first reset sub-circuit and the second reset sub-circuit, the potentials of the control terminal N1 of the driving sub-circuit and the second terminal N2 of the first coupling sub-circuit are maintained in the light emitting phase P3 under low frequency conditions, and therefore, when the display substrate provided by the embodiments of the present disclosure includes the above-mentioned pixel driving circuit, the display substrate can be effectively compatible with high-frequency display and low-frequency display, and meet people's needs for high refresh rate and low power consumption.

As shown in FIGS. 4 and 13, in some embodiments, the data writing-in sub-circuit in the pixel driving circuit includes a first transistor T1, the compensation sub-circuit includes a second transistor T2, and the driving sub-circuit includes a third transistor T3. The first reset sub-circuit includes a fourth transistor T4, the second reset sub-circuit includes a fifth transistor T5, the first light emitting control sub-circuit includes a sixth transistor T6, the first coupling sub-circuit includes a first capacitor C1, and the second coupling sub-circuit includes the second capacitor C2;

The first capacitor C1 includes a first electrode plate C11 and a second electrode plate C12 disposed oppositely, and the first electrode plate C11 is located between the second electrode plate C12 and the substrate;

As shown in FIGS. 8 and 17, the second transistor T2, the fourth transistor T4, and the fifth transistor T5 all include N-type oxide transistors, and the second transistor T2 includes a second active pattern 502, the fourth transistor T4 includes a fourth active pattern 504, and the fifth transistor T5 includes a fifth active pattern 505;

The second active pattern 502, the fourth active pattern 504, and the fifth active pattern 505 are arranged in the same layer and made of the same material. The fourth active pattern 504 is located between the second control signal line and the substrate, the fourth active pattern 504 is located on a side of the second electrode plate away from the substrate.

Exemplarily, the first electrode plate C11 of the first capacitor C1 is multiplexed as the gate electrode of the third transistor T3, and an orthographic projection of the first electrode plate C11 of the first capacitor C1 on the substrate at least partially overlaps an orthographic projections of the second electrode plate C12 of the first capacitor C1 on the substrate.

Exemplarily, the second active pattern 502, the fourth active pattern 504, and the fifth active pattern 505 are all made of IGZO material.

Exemplarily, the first active pattern 101 included in the first transistor T1 and the sixth active pattern 106 included in the sixth transistor T6 are formed as an integral structure.

Exemplarily, the third transistor T3 further includes a third active pattern 103.

Exemplarily, the first active pattern 101 includes a portion extending in a first direction and a portion extending in a second direction; the sixth active pattern 106 includes a portion extending in the first direction and a portion extending in the second direction.

As shown in FIGS. 8 and 17, in some embodiments, the second active pattern 502 extends along the second direction, the fourth active pattern 504 extends along the first direction, and the second active patterns 502 and the fourth active pattern 504 are formed into an integrated structure, and an orthographic projection of the second active pattern 502 on the substrate is located between an orthographic projection of the first control signal line pattern on the substrate and an orthographic projection of the second control signal line pattern on the substrate.

Exemplarily, the second active pattern 502 and the fourth active pattern 504 are formed in a structure similar to "⌐".

Exemplarily, the gate electrode of the second transistor T2 and the second control signal line pattern are formed as an integrated structure.

In the above arrangement, the second active pattern 502 and the fourth active pattern 504 are formed as an integrated structure, so that the second active pattern 502 and the fourth active pattern 504 can be formed in the same patterning process, which is beneficial to simplify the manufacturing process of the display substrate.

The display substrate in the above layout mode is beneficial to reduce the layout space occupied by a single pixel driving circuit, and is beneficial to improve the resolution of the display substrate.

As shown in FIGS. 4, 8, 13 and 17, in some embodiments, the fifth active pattern 505 extends along the second direction, and an orthographic projection of the fifth active pattern 505 on the substrate is located between an orthographic projection of the third control signal line pattern ion the substrate and an orthographic projection of the second electrode plate on the substrate.

The display substrate adopting the above-mentioned layout method not only ensures the stability and reliability of the pixel driving circuit, but also facilitates to reduce the layout space occupied by a single pixel driving circuit, and improve the resolution of the display substrate.

As shown in FIGS. 4 and 8, in some embodiments, in the case that the pixel driving circuit further includes a second light emitting control sub-circuit and a third reset sub-circuit, the third reset sub-circuit includes an eighth transistor T8, the eighth transistor T8 includes an eighth active pattern 508, the eighth active pattern 508 extends along the second direction, and the eighth active pattern 508 and the second active pattern 502 are arranged at the same layer and made of the same material.

Exemplarily, the second active layer 50 further includes the eighth active pattern 508.

As described above, the eighth active pattern 508 and the second active pattern 502 are arranged in the same layer and made of the same material, so that the eighth active pattern 508 and the second active pattern 502 can be formed in the same patterning process, which is conducive to simplify the manufacturing process of the display substrate.

Moreover, the eighth active pattern 508 is made of IGZO material, so that the eighth transistor T8 is formed as an N-type oxide transistor, which is more conducive to the potential stability of the N5 node.

As shown in FIG. 4, in some embodiments, the third control signal line pattern is also multiplexed as the first control terminal AZn coupled to the third reset sub-circuit included in the pixel driving circuit in adjacent sub-pixels in the first direction. The gate electrode of the eighth transistor T8 is coupled to the third control signal line pattern in the adjacent sub-pixels along the first direction; an orthographic projection of the eighth active pattern 508 on the substrate is located between an orthographic projection of the initialization signal line pattern on the substrate and the orthographic projection of the third control signal line pattern in the adjacent sub-pixel along the first direction on the substrate.

Exemplarily, the gate electrode of the eighth transistor T8 and the third control signal line pattern (AZn−1' in FIG. 4) in the adjacent sub-pixel along the first direction are formed as an integrated structure.

Exemplarily, the first control signal line pattern is the same as a signal transmitted by the third control signal line pattern in the adjacent sub-pixel along the first direction.

The display substrate adopting the above-mentioned layout method not only ensures the stability and reliability of the pixel driving circuit, but also facilitates to reduce the layout space occupied by a single pixel driving circuit, and improve the resolution of the display substrate.

In some embodiments, the orthographic projection of the initialization signal line pattern on the substrate, the orthographic projection of the light emitting control signal line pattern on the substrate, the orthographic projection of the data writing-in control line pattern on the substrate, the orthographic projection of the second control signal line pattern on the substrate, the orthographic projection of the first control signal line pattern on the substrate, and the orthographic projection of the third control signal line pattern on the substrate are arranged in sequence along the first direction. This arrangement reduces the layout difficulty of the pixel driving circuit and effectively reduces the layout space, which is beneficial to improve the resolution of the display substrate.

As shown in FIG. 13 and FIG. 14, in some embodiments, in the case that the pixel driving circuit further includes a second light emitting control sub-circuit and a fourth reset sub-circuit, the second light emitting control sub-circuit includes a seventh transistor T7, the seventh transistor T7 includes a seventh active pattern 107, the fourth reset sub-circuit includes a ninth transistor T9, the ninth transistor T9 includes a ninth active pattern 109, and the seventh active pattern 107 and the ninth active pattern 109 both extend along the first direction, and the seventh active pattern 107 and the ninth active pattern 109 are formed as an integrated structure.

Exemplarily, the first active layer 10 includes the seventh active pattern 107 and the ninth active pattern 109.

The seventh active pattern 107 and the ninth active pattern 109 are formed as an integrated structure as described above, so that the seventh active pattern 107 and the ninth active pattern 109 can be formed in the same patterning process, which is beneficial to simplify the manufacturing process of the display substrate.

As shown in FIGS. 13 and 14, in some embodiments, the orthographic projection of the ninth active pattern 109 on the substrate is located between the orthographic projection of the light emitting control signal line pattern on the substrate, and the orthographic projection of the initialization signal line pattern on the substrate.

The display substrate adopting the above-mentioned layout method not only ensures the stability and reliability of the pixel driving circuit, but also helps to reduce the layout space occupied by a single pixel driving circuit, and is beneficial to improve the resolution of the display substrate.

In some embodiments, the orthographic projection of the initialization signal line pattern on the substrate, the orthographic projection of the data writing-in control line pattern on the substrate, the orthographic projection of the light emitting control signal line pattern on the substrate, the orthographic projection of the second control signal line pattern on the substrate, the orthographic projection of the first control signal line pattern on the substrate, and the orthographic projection of the third control signal line pattern on the substrate are arranged in sequence along the first direction. This arrangement reduces the layout difficulty of the pixel driving circuit and effectively reduces the layout space, which is beneficial to improve the resolution of the display substrate.

As shown in FIGS. 4 and 13, in some embodiments, the plurality of sub-pixels are divided into a plurality of rows of sub-pixels arranged in a first direction, and each row of sub-pixels include a plurality of sub-pixels arranged in a second direction.

The display substrate further includes a plurality of first compensation lines 31, the plurality of first compensation lines 31 correspond to at least part of the plurality of rows of sub-pixel in a one-to-one manner, and the first compensation lines 31 are respectively coupled to reference signal line patterns included the respective sub-pixels in the corresponding row of sub-pixels.

Exemplarily, at least part of the first compensation lines 31 extend along the second direction.

Exemplarily, at least part of the second compensation lines 32 extend along the second direction, and the orthographic projection of the second compensation line 32 on the substrate is located between the orthographic projection of the first compensation line 31 on the substrate and the orthographic projection of the third control signal line pattern on the substrate.

In the above arrangement, the first compensation lines 31 are respectively coupled to reference signal line patterns included the respective sub-pixels in the corresponding row of sub-pixels, which is more conducive to the uniformity and stability of the reference signal provided by the reference signal line pattern.

An embodiment of the present disclosure also provides a display device, which includes the display substrate provided in the foregoing embodiment.

The display substrate provided by the foregoing embodiment can avoid the problem that the stability of the surrounding transistors is interfered with the changes in the data signal transmitted on the data line pattern; and can reduce the layout difficulty of the pixel driving circuit, effectively reduce the occupied layout space, and improve the resolution of the display substrate. At the same time, the display substrate can be effectively compatible with high-frequency display and low-frequency display, and meet people's requirements for high refresh frequency and low power consumption functions.

Therefore, when the display device provided by the embodiment of the present disclosure includes the above-mentioned display substrate, it also has the above-mentioned beneficial effects, which will not be repeated here.

It should be noted that the display device may be any product or component with a display function, such as a TV, a monitor, a digital photo frame, a mobile phone, a tablet computer, and the like.

It should be noted that the various embodiments in this specification are described in a progressive manner, and the same or similar parts among the various embodiments can be referred to each other, and each embodiment focuses on the differences from other embodiments. In particular, for the method embodiment, since it is basically similar to the product embodiment, the description is relatively simple, and the relevant part can be referred to the description of the product embodiment.

Unless otherwise defined, the technical or scientific terms used in the present disclosure shall have the usual meanings understood by those with ordinary skills in the field to which this disclosure belongs. The "first", "second" and similar words used in the present disclosure do not indicate any order, quantity or importance, but are only used to distinguish different components. The word "include" or "comprise" and other similar words mean that the element or item appearing before the word encompasses the element or item listed after the word and its equivalents, but does not exclude other elements or items. Similar words such as "connected" or "coupled" are not limited to physical or mechanical connections, but may include electrical connections, whether direct or indirect. "Up", "Down", "Left", "Right", etc. are only used to indicate the relative position relationship. When the absolute position of the described object changes, the relative position relationship may also change accordingly.

It can be understood that when an element such as a layer, film, region, or substrate is referred to as being "on" or "under" another element, the element can be "directly" on or "under" the other element, or there may be intermediate elements therebetween.

In the description of the foregoing embodiments, specific features, structures, materials, or characteristics may be combined in any one or more embodiments or examples in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A pixel driving circuit for driving a light emitting element, comprising:
    a driving sub-circuit, a first terminal of the driving sub-circuit being coupled to a first level signal output terminal, a second terminal of the driving sub-circuit being coupled to the light emitting element; the driving sub-circuit including a third active pattern;
    a compensation sub-circuit, respectively coupled to a first control terminal, a control terminal of the driving sub-circuit and the second terminal of the driving sub-circuit; the compensation sub-circuit including a second active pattern;
    a first coupling sub-circuit, a first terminal of the first coupling sub-circuit being coupled to the control terminal of the driving sub-circuit;
    a second coupling sub-circuit, a first terminal of the second coupling sub-circuit being coupled to a second terminal of the first coupling sub-circuit;
    a first reset sub-circuit, respectively coupled to a second control terminal, the control terminal of the driving sub-circuit and an initialization signal output terminal; the first reset sub-circuit including a fourth active pattern;
    a second reset sub-circuit, respectively coupled to a third control terminal, a second terminal of the first coupling sub-circuit and the first level signal output terminal; the second reset sub-circuit including a fifth active pattern;
    a first light emitting control sub-circuit, respectively coupled to a light emitting control terminal, a second terminal of the second coupling sub-circuit and a reference signal output terminal;
    a data writing-in sub-circuit, respectively coupled to a writing-in control terminal, the second terminal of the second coupling sub-circuit and a data signal input terminal;
    wherein the second active pattern, the fourth active pattern, and the fifth active pattern are all arranged at different layers from the third active pattern.

2. The pixel driving circuit according to claim 1, further comprising:
    a second light emitting control sub-circuit, respectively coupled to the light emitting control terminal, the second terminal of the driving sub-circuit and the light emitting element; configured to control to electrically connect or disconnect the second terminal of the driving sub-circuit and the light emitting element under the control of the light emitting control terminal;
    a third reset sub-circuit, respectively coupled to the first control terminal, the light emitting element and the initialization signal output terminal; configured to control to electrically connect or disconnect the light emitting element and the initialization signal output terminal under the control of the first control terminal.

3. The pixel driving circuit according to claim 2, wherein the second light emitting control sub-circuit includes a seventh transistor, and a gate electrode of the seventh transistor is coupled to the light emitting control terminal, a first electrode of the seventh transistor is coupled to the second terminal of the driving sub-circuit, and a second electrode of the seventh transistor is coupled to the light emitting element;
    the third reset sub-circuit includes an eighth transistor, a gate electrode of the eighth transistor is coupled to the first control terminal, and a first electrode of the eighth transistor is coupled to the initialization signal output terminal, and a second electrode of the eighth transistor is coupled to the light emitting element.

4. The pixel driving circuit according to claim 1, further comprising:
    a second light emitting control sub-circuit, the second terminal of the driving sub-circuit being coupled to the light emitting element through the second light emitting control sub-circuit; the second light emitting control sub-circuit being respectively coupled to the light emitting control terminal, the second terminal of the driving sub-circuit and the light emitting element; configured to control to electrically connect or disconnect the second terminal of the driving sub-circuit and the light emitting element under the control of the light emitting control terminal;
    a fourth reset sub-circuit, respectively coupled to the writing-in control terminal, the light emitting element and the initialization signal output terminal; configured to control to electrically connect or disconnect the light emitting element and the initialization signal output terminal under the control of the writing-in control terminal.

5. The pixel driving circuit according to claim 4, wherein the second light emitting control sub-circuit includes a seventh transistor, and a gate electrode of the seventh transistor is coupled to the light emitting control terminal, a first electrode of the seventh transistor is coupled to the second terminal of the driving sub-circuit, and a second electrode of the seventh transistor is coupled to the light emitting element;
    the fourth reset sub-circuit includes a ninth transistor, a gate electrode of the ninth transistor is coupled to the writing-in control terminal, and a first electrode of the ninth transistor is coupled to the initialization signal output terminal, and the second electrode of the ninth transistor is coupled to the light emitting element.

6. The pixel driving circuit according to claim 1, wherein the data writing-in sub-circuit includes a first transistor, the compensation sub-circuit includes a second transistor, and the driving sub-circuit includes a third transistor, the first reset sub-circuit includes a fourth transistor, the second reset sub-circuit includes a fifth transistor, the first light emitting control sub-circuit includes a sixth transistor, and the first coupling sub-circuit includes a first capacitor, the second coupling sub-circuit includes a second capacitor;
    a gate electrode of the first transistor is coupled to the writing-in control terminal, a first electrode of the first transistor is coupled to the data signal input terminal, and a second electrode of the first transistor is coupled to a second terminal of the second capacitor;
    a gate electrode of the second transistor is coupled to the first control terminal, a first electrode of the second transistor is coupled to a second electrode of the third transistor, and a second electrode of the second transistor is coupled to a gate electrode of the third transistor;

a first electrode of the third transistor is coupled to the first level signal output terminal;

a gate electrode of the fourth transistor is coupled to the second control terminal, a first electrode of the fourth transistor is coupled to the initialization signal output terminal, and a second electrode of the fourth transistor is coupled to the gate electrode of the third transistor;

a gate electrode of the fifth transistor is coupled to the third control terminal, a first electrode of the fifth transistor is coupled to the first level signal output terminal, and a second electrode of the fifth transistor is coupled to a second terminal of the first capacitor;

a gate electrode of the sixth transistor is coupled to the light emitting control terminal, a first electrode of the sixth transistor is coupled to the reference signal output terminal, and a second electrode of the sixth transistor is coupled to the second terminal of the second capacitor;

a first terminal of the first capacitor is coupled to the gate electrode of the third transistor;

a first terminal of the second capacitor is coupled to the second terminal of the first capacitor.

7. The pixel driving circuit according to claim 6, wherein the first transistor, the third transistor, and the sixth transistor all include P-type low-temperature polysilicon transistors, and the second transistor, the fourth transistor and the fifth transistor all include N-type oxide transistors.

8. A method of driving a pixel driving circuit according to claim 1, wherein the method comprises: within each display period, in a reset phase, under the control of the second control terminal, the first reset sub-circuit controlling to electrically connect the control terminal of the driving sub-circuit and the initialization signal output terminal; under the control of the third control terminal, the second reset sub-circuit controlling to electrically connect the second terminal of the first coupling sub-circuit and the first level signal output terminal; under the control of the writing-in control terminal, the data writing-in sub-circuit controlling to electrically connect the second terminal of the second coupling sub-circuit and the data signal input terminal;

in a compensation phase, under the control of the second control terminal, the first reset sub-circuit controlling to disconnect the electric connection between the control terminal of the driving sub-circuit and the initialization signal output terminal; under the control of the third control terminal, the second reset sub-circuit continuing to control to electrically connect the second terminal of the first coupling sub-circuit and the first level signal output terminal; under the control of the writing-in control terminal, the data writing-in sub-circuit controlling to disconnect the electric connection between the second terminal of the second coupling sub-circuit and the data signal input terminal; under the control of the first control terminal, the compensation sub-circuit controlling to electrically connect the control terminal of the driving sub-circuit and the second terminal of the driving sub-circuit; the driving sub-circuit controlling to electrically connect the first level signal output terminal and the compensation sub-circuit until a threshold voltage of the driving sub-circuit is written into the control terminal of the driving sub-circuit;

in a light emitting phase, under the control of the second control terminal, the first reset sub-circuit controlling to disconnect the electric connection between the control terminal of the driving sub-circuit and the initialization signal output terminal; under the control of the third control terminal, the second reset sub-circuit controlling to disconnect the electric connection between the second terminal of the first coupling sub-circuit and the first level signal output terminal; under the control of the writing-in control terminal, the data writing-in sub-circuit controlling to disconnect the electric connection between the second terminal of the second coupling sub-circuit and the data signal input terminal; under the control of the first control terminal, the compensation sub-circuit controlling to disconnect the electric connection between the control terminal of the driving sub-circuit and the second terminal of the driving sub-circuit; under the control of the light emitting control terminal, the first light emitting control sub-circuit controlling to electrically connect the second terminal of the second coupling sub-circuit and the reference signal output terminal; the driving sub-circuit controlling to electrically connect the first level signal output terminal and the light emitting element, and transmit the generated driving signal to the light emitting element.

9. The method according to claim 8, wherein in the case that the pixel driving circuit further includes a second light emitting control sub-circuit and a third reset sub-circuit, the method further includes:

in the reset phase, under the control of the light emitting control terminal, the second light emitting control sub-circuit controlling to disconnect the electric connection between the second terminal of the driving sub-circuit and the light emitting element; under the control of the first control terminal, the third reset sub-circuit controlling to disconnect the electric connection between the light emitting element and the initialization signal output terminal;

in the compensation phase, under the control of the light emitting control terminal, the second light emitting control sub-circuit controlling to disconnect the electric connection between the second terminal of the driving sub-circuit and the light emitting element; under the control of the first control terminal, the third reset sub-circuit controlling to electrically connect the light emitting element and the initialization signal output terminal;

in the light emitting phase, under the control of the light emitting control terminal, the second light emitting control sub-circuit controlling to electrically connect the second terminal of the driving sub-circuit and the light emitting element; under the control of the first control terminal, the third reset sub-circuit controlling to disconnect the electric connection between the light emitting element and the initialization signal output terminal.

10. The method according to claim 8, wherein, in the case the pixel driving circuit further includes a second light emitting control sub-circuit and a fourth reset sub-circuit, the method further includes:

in the reset phase, under the control of the light emitting control terminal, the second light emitting control sub-circuit controlling to disconnect the electric connection between the second terminal of the driving sub-circuit and the light emitting element; under the control of the writing-in control terminal, the fourth reset sub-circuit controlling to electrically connect the light emitting element and the initialization signal output terminal;

in the compensation phase, under the control of the light emitting control terminal, the second light emitting control sub-circuit controlling to disconnect the electric connection between the second terminal of the driving sub-circuit and the light emitting element; under the control of the writing-in control terminal, the fourth reset sub-circuit controlling to disconnect the electric connection between the light emitting element and the initialization signal output terminal;

in the light emitting phase, under the control of the light emitting control terminal, the second light emitting control sub-circuit controlling to electrically connect the second terminal of the driving sub-circuit and the light emitting element; under the control of the writing-in control terminal, the fourth reset sub-circuit controlling to disconnect the electric connection between the light emitting element and the initialization signal output terminal.

11. A display substrate comprising a substrate and a plurality of sub-pixels arranged in an array on the substrate; wherein the sub-pixel includes the pixel driving circuit according to claim 1, the sub-pixel further includes:
   a power line pattern, at least part of the power line pattern extending along a first direction, and the power line pattern being multiplexed as the first level signal output terminal;
   a data line pattern, at least part of the data line pattern extending along the first direction, and the data line pattern being multiplexed as the data signal input terminal;
   a reference signal line pattern, at least part of the reference signal line pattern extending along the first direction, the reference signal line pattern being multiplexed as the reference signal output terminal; the data line pattern being located between the power line pattern and the reference signal line pattern;
   a first control signal line pattern, at least part of the first control signal line pattern extending in a second direction, the second direction intersecting the first direction, and the first control signal line pattern being multiplexed as the first control terminal coupled to the compensation sub-circuit in the pixel driving circuit;
   a second control signal line pattern, at least part of the second control signal line pattern extending along the second direction, and the second control signal line pattern being multiplexed as the second control terminal;
   a third control signal line pattern, at least part of the third control signal line pattern extending along the second direction, and the third control signal line pattern being multiplexed into the third control terminal;
   an initialization signal line pattern, at least part of the initialization signal line pattern extending along the second direction, and the initialization signal line pattern being multiplexed as the initialization signal output terminal;
   a light emitting control signal line pattern, at least part of the light emitting control signal line pattern extending along the second direction, and the light emitting control signal line pattern being multiplexed as the light emitting control terminal;
   a data writing-in control line pattern, at least part of the data writing-in control line pattern extending along the second direction, and the data writing-in control line pattern being multiplexed as the writing-in control terminal.

12. The display substrate according to claim 11, wherein the data writing-in sub-circuit in the pixel driving circuit includes a first transistor, the compensation sub-circuit includes a second transistor, and the driving sub-circuit includes a third transistor, the first reset sub-circuit includes a fourth transistor, the second reset sub-circuit includes a fifth transistor, the first light emitting control sub-circuit includes a sixth transistor, the first coupling sub-circuit includes a first capacitor, and the second coupling sub-circuit includes a second capacitor;
   the first capacitor includes a first electrode plate and a second electrode plate disposed oppositely, and the first electrode plate is located between the second electrode plate and the substrate;
   the second transistor, the fourth transistor, and the fifth transistor all include N-type oxide transistors, and the second transistor includes a second active pattern, the fourth transistor includes a fourth active pattern, and the fifth transistor includes a fifth active pattern;
   the second active pattern, the fourth active pattern, and the fifth active pattern are arranged in the same layer and made of the same material, the fourth active pattern is located between the second control signal line and the substrate, the fourth active pattern is located on a side of the second electrode plate away from the substrate.

13. The display substrate according to claim 12, wherein the second active pattern extends along the second direction, the fourth active pattern extends along the first direction, and the second active pattern and the fourth active pattern are formed into an integrated structure, and an orthographic projection of the second active pattern on the substrate is located between an orthographic projection of the first control signal line pattern on the substrate and an orthographic projection of the second control signal line pattern on the substrate.

14. The display substrate according to claim 12, wherein the fifth active pattern extends along the second direction, and an orthographic projection of the fifth active pattern on the substrate is located between an orthographic projection of the third control signal line pattern ion the substrate and an orthographic projection of the second electrode plate on the substrate.

15. The display substrate according to claim 12, wherein, in the case that the pixel driving circuit further includes a second light emitting control sub-circuit and a third reset sub-circuit, the third reset sub-circuit includes an eighth transistor, the eighth transistor includes an eighth active pattern, the eighth active pattern extends along the second direction, and the eighth active pattern and the second active pattern are arranged at a same layer and made of a same material.

16. The display substrate according to claim 15, wherein the third control signal line pattern is multiplexed as the first control terminal coupled to the third reset sub-circuit included in a pixel driving circuit in an adjacent sub-pixel along the first direction, an gate electrode of the eighth transistor is coupled to the third control signal line pattern in the adjacent sub-pixel along the first direction; an orthographic projection of the eighth active pattern on the substrate is located between an orthographic projection of the initialization signal line pattern on the substrate and an orthographic projection of the third control signal line pattern in the adjacent sub-pixel along the first direction on the substrate.

17. The display substrate according to claim 12, wherein, in the case that the pixel driving circuit further includes a second light emitting control sub-circuit and a fourth reset sub-circuit, the second light emitting control sub-circuit includes a seventh transistor, the seventh transistor includes a seventh active pattern, the fourth reset sub-circuit includes a ninth transistor, the ninth transistor includes a ninth active pattern, and the seventh active pattern and the ninth active pattern both extend along the first direction, and the seventh active pattern and the ninth active pattern are formed as an integrated structure.

18. The display substrate according to claim 17, wherein an orthographic projection of the ninth active pattern on the substrate is located between the orthographic projection of the light emitting control signal line pattern on the substrate and the orthographic projection of the initialization signal line pattern on the substrate.

19. The display substrate according to claim 11, wherein the plurality of sub-pixels are divided into a plurality of rows of sub-pixels arranged in the first direction, and each row of sub-pixels include a plurality of sub-pixels arranged in the second direction, the display substrate further includes a plurality of first compensation lines, the plurality of first compensation lines correspond to at least part of the plurality of rows of sub-pixels in a one-to-one manner, and the plurality of first compensation lines are respectively coupled to reference signal line patterns included in sub-pixels of the corresponding row of sub-pixels.

20. A display device comprising the display substrate according to claim 11.

\* \* \* \* \*